(12) United States Patent
Yabe

(10) Patent No.: US 11,972,807 B2
(45) Date of Patent: Apr. 30, 2024

(54) CHARGE PUMP CURRENT REGULATION DURING VOLTAGE RAMP

(71) Applicant: SanDisk Technologies LLC, Addison, TX (US)

(72) Inventor: Hiroki Yabe, Yokohama (JP)

(73) Assignee: SanDisk Technologies LLC, Austin, TX (US)

( * ) Notice: Subject to any disclaimer, the term of this patent is extended or adjusted under 35 U.S.C. 154(b) by 183 days.

(21) Appl. No.: 17/741,805

(22) Filed: May 11, 2022

(65) Prior Publication Data
US 2023/0368847 A1  Nov. 16, 2023

(51) Int. Cl.
| | | |
|---|---|---|
| G11C 16/30 | (2006.01) | |
| G11C 16/04 | (2006.01) | |
| G11C 16/08 | (2006.01) | |
| G11C 16/26 | (2006.01) | |
| G11C 16/32 | (2006.01) | |
| H02M 3/07 | (2006.01) | |
| H01L 25/065 | (2023.01) | |
| H10B 43/27 | (2023.01) | |

(52) U.S. Cl.
CPC .......... *G11C 16/30* (2013.01); *G11C 16/0483* (2013.01); *G11C 16/08* (2013.01); *G11C 16/26* (2013.01); *G11C 16/32* (2013.01); *H02M 3/07* (2013.01); *H01L 25/0657* (2013.01); *H01L 2225/06562* (2013.01); *H10B 43/27* (2023.02)

(58) Field of Classification Search
CPC ..... G11C 16/30; G11C 16/0483; G11C 16/08; G11C 16/26; G11C 16/32; G11C 5/145; H02M 3/07; H01L 25/0657; H01L 2225/06562; H10B 43/27
See application file for complete search history.

(56) References Cited

U.S. PATENT DOCUMENTS

| | | | | |
|---|---|---|---|---|
| 5,222,045 | A * | 6/1993 | Ohbayashi | G11C 7/062 365/210.12 |
| 6,812,776 | B2 | 11/2004 | Henry | |
| 9,164,526 | B2 | 10/2015 | Pan et al. | |
| 9,479,050 | B1 | 10/2016 | Reddy et al. | |
| 9,653,126 | B2 | 5/2017 | Nguyen et al. | |
| 10,359,474 | B2 * | 7/2019 | Soga | G01R 31/3648 |

(Continued)

FOREIGN PATENT DOCUMENTS

EP  1676355 B1  6/2010

*Primary Examiner* — Khamdan N. Alrobaie
(74) *Attorney, Agent, or Firm* — Vierra Magen Marcus LLP

(57) ABSTRACT

Technology is disclosed herein for a memory system that regulates charge pump current during a ramp up of the output voltage. The memory systems operates the charge pump in a current regulation mode while the charge pump output voltage ramps up. After the output voltage crosses a threshold voltage, the charge pump is operated in a voltage regulation mode in which the output voltage is regulated to a target output voltage. In one aspect, the memory system generates a random duty cycle clock in the current regulation mode. The memory system determines a target duty cycle for the random duty cycle clock that will regulate the input current of the charge pump to a target current, given the present output voltage. A clock based on the random duty cycle clock is provided to a clock input of the charge pump to regulate the charge pump current.

20 Claims, 19 Drawing Sheets

(56) References Cited

U.S. PATENT DOCUMENTS

| | | |
|---|---|---|
| 10,998,816 B1 | 5/2021 | Payak |
| 2009/0016135 A1* | 1/2009 | Tomita .................. G11C 11/406 |
| | | 327/39 |
| 2012/0049903 A1 | 3/2012 | Oh et al. |
| 2021/0391865 A1 | 12/2021 | Sokolov et al. |
| 2021/0399650 A1* | 12/2021 | Ujimaru .............. H02M 1/0032 |

* cited by examiner

Figure 4C
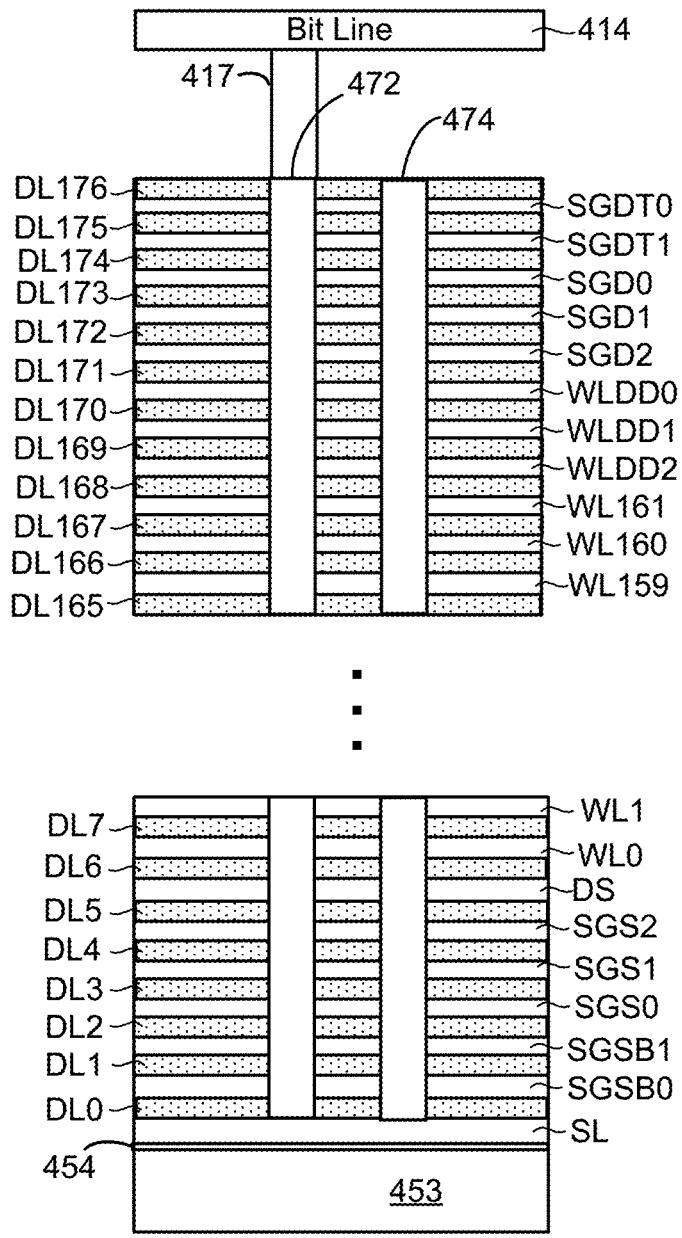
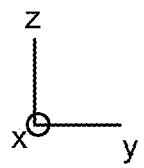

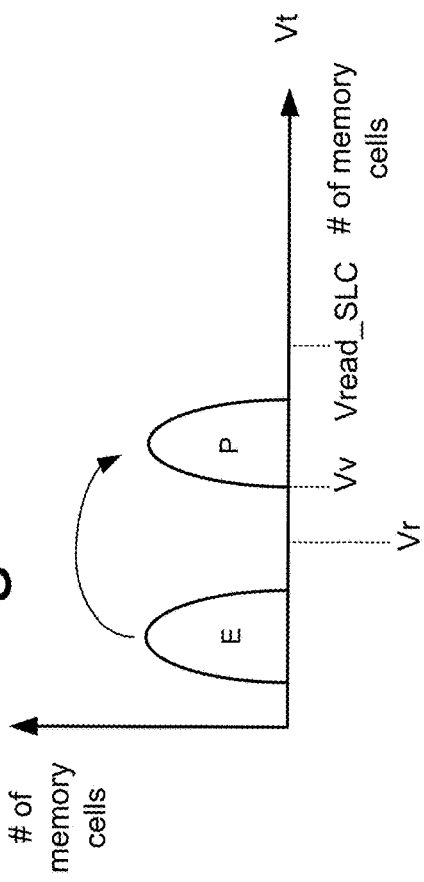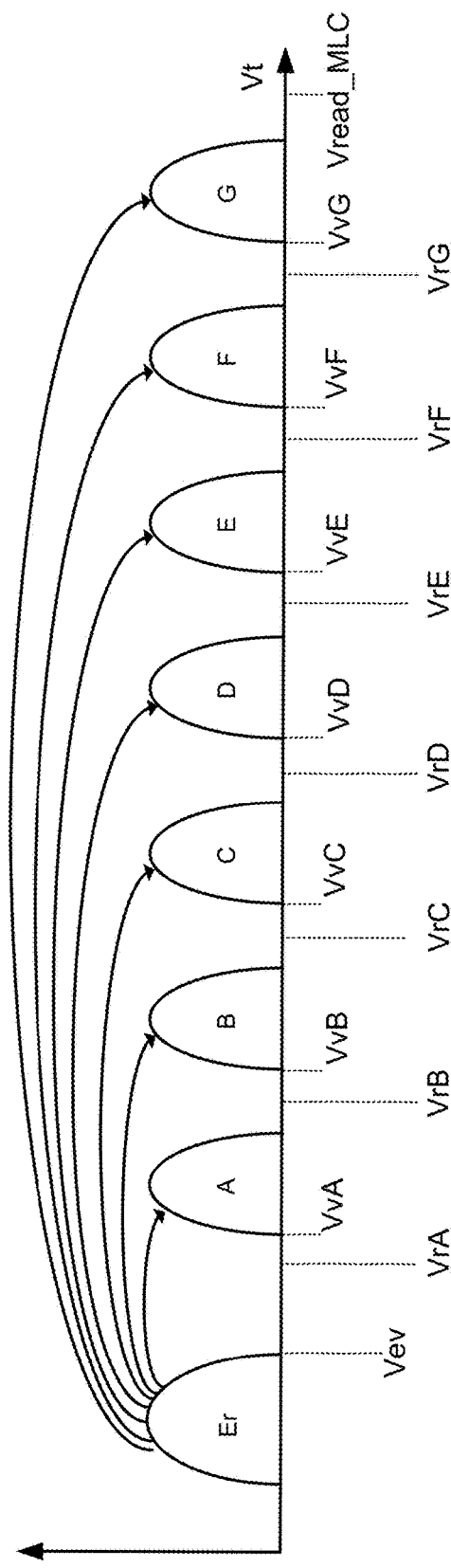

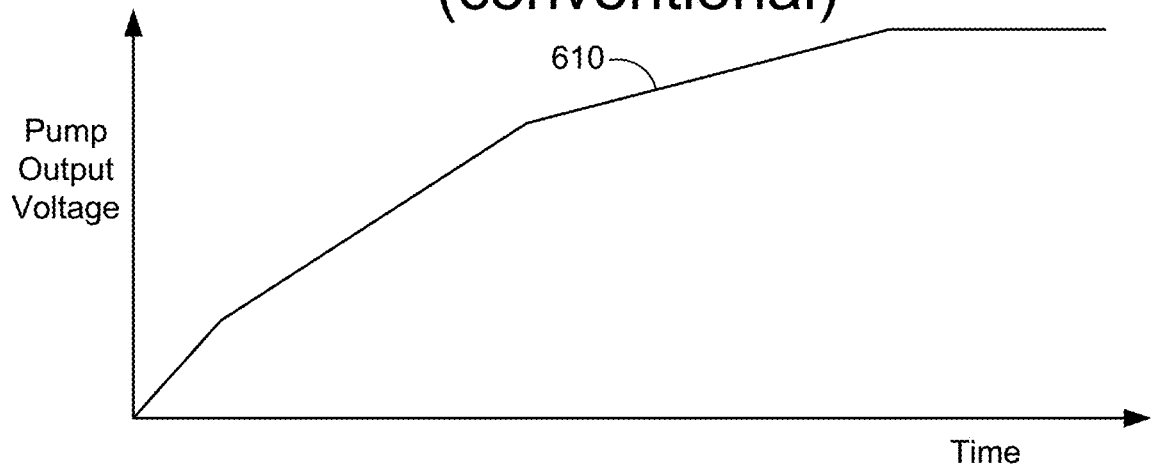
Figure 6A
(conventional)
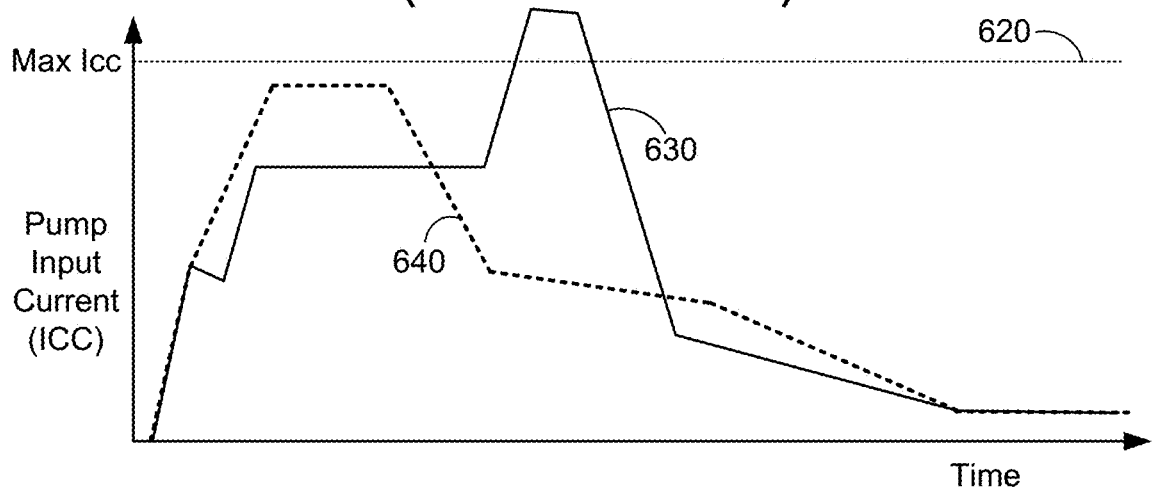
Figure 6B
(conventional)

Figure 11
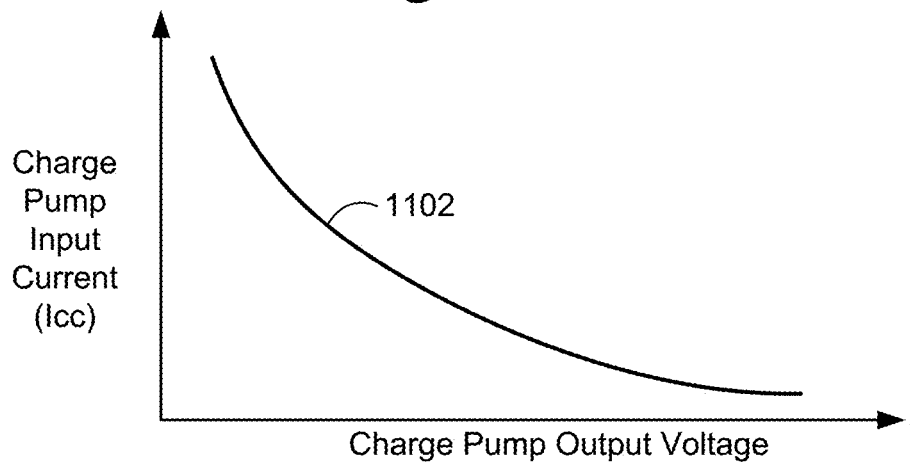
Figure 12
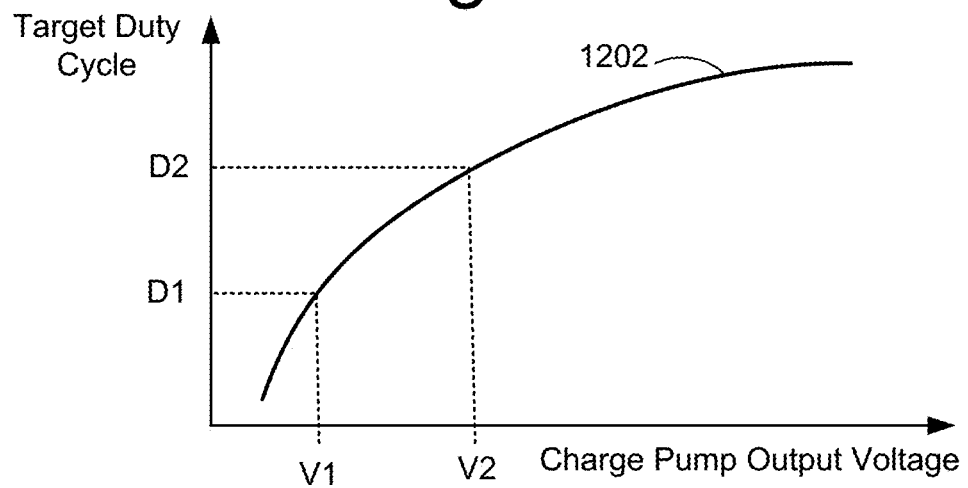
Figure 13
| Output Voltage | Duty |
|---|---|
| 4V – 5V | Percentage 1 |
| 5V – 6V | Percentage 2 |
| 6V – 7V | Percentage 3 |
| 7V – 8V | Percentage 4 |
| ... | ... |
1300

CHARGE PUMP CURRENT REGULATION DURING VOLTAGE RAMP

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The control lines can include word lines, bit lines, and other control lines. In a NAND memory system each NAND string contains memory cell transistors connected in series, a drain side select gate at one end, and a source side select gate at the other end. Typically, a word line connects to the control gates of memory cells on many NAND strings. Operating voltages need to be provided to the control lines during memory operations. The operating voltages have different magnitudes depending on their purpose and the control line to which they are applied.

The memory system may receive a supply voltage from a host system. Typically, the supply voltage is provided to a voltage regulator in the memory system that can translate the supply voltage to the many different operating voltages. The voltage regulator can include charge pumps that are capable of increasing the magnitude of the supply voltage. A charge pump typically uses capacitors as energy storage devices to provide an output voltage that is higher than the supply voltage. It will take some time for the charge pump output voltage to ramp up to the target operating voltage. Also, factors such as the capacitance of the various control lines may impact the ramping up of the charge pump output voltage. Typically, the maximum amount of current that the memory system is allowed to draw from the host is limited to a specified amount. The charge pumps can draw a very large current, especially when ramping up the operating voltage.

BRIEF DESCRIPTION OF THE DRAWINGS

Like-numbered elements refer to common components in the different figures.

FIG. 4C depicts a portion of one embodiment of a three dimensional memory structure showing a cross-sectional view along line AA of FIG. 4B.

FIGS. 5A and 5B depicts threshold voltage distributions.

FIGS. 6A-6C are graphs that illustrate output voltage, current, and load capacitance in a conventional ramping up of a charge pump.

FIG. 11 is a graph depicting an example charge pump input current (Icc) versus charge pump output voltage.

FIG. 12 depicts a plot of target duty cycle versus charge pump output voltage.

FIG. 13 is an embodiment of a table that maps output voltage to target duty cycle for the random duty cycle clock.

DETAILED DESCRIPTION

Technology is disclosed herein for a memory system that regulates charge pump current during a ramp up of the output voltage. In an embodiment, the memory systems operates the charge pump in a current regulation mode in which the input current of the charge pump is regulated to a target current while the charge pump output voltage ramps up to a threshold voltage. After the output voltage crosses the threshold voltage, the charge pump is operated in a voltage regulation mode in which the output voltage is regulated to a target output voltage. During voltage ramp up, the capacitance of the load on the charge pump could vary significantly based on the pattern of data stored in the memory cells. The load capacitance will impact the input current (Icc) of the charge pump. In an embodiment, the memory system regulates the charge pump's input current to be at or close to a target current. If instead, the charge pump's input current were not regulated during ramp up there could be very large changes in the input current during ramp up. Also, the input current can depend on the pattern of data stored in the memory cells, as will be explained in more detail below. In some cases, the charge pump could potentially draw more current than is allowed. The current regulation mode keeps the input current below a maximum allowed current. In some cases, the charge pump current could be much lower than the maximum allowed current if the current is not regulated. In an embodiment, the current regulation mode provides for a faster ramp rate by using more current than would be used without current regulation, but still staying within the current budget.

In one embodiment, the clock that is input to the charge pump is based on a random duty cycle clock. The duty cycle of the random duty cycle clock changes randomly from one cycle to the next, but over a time window the average duty cycle will be equal to a target duty cycle. The memory system determines a target duty cycle that will regulate the input current of the charge pump to a target current, given the present output voltage. For example, the memory system may have a table that maps the output voltage to a target duty cycle. A clock signal that is based on the random duty cycle clock is provided to a clock input of the charge pump. For example, when the random duty cycle clock signal has a high state a constant frequency clock signal is passed to the charge pump as an input pump clock; however, when the random duty cycle clock signal has a low state the constant frequency clock signal is blocked from reaching the charge pump. Therefore, the charge pump current is regulated to be at or near the target current.

Figure 1:
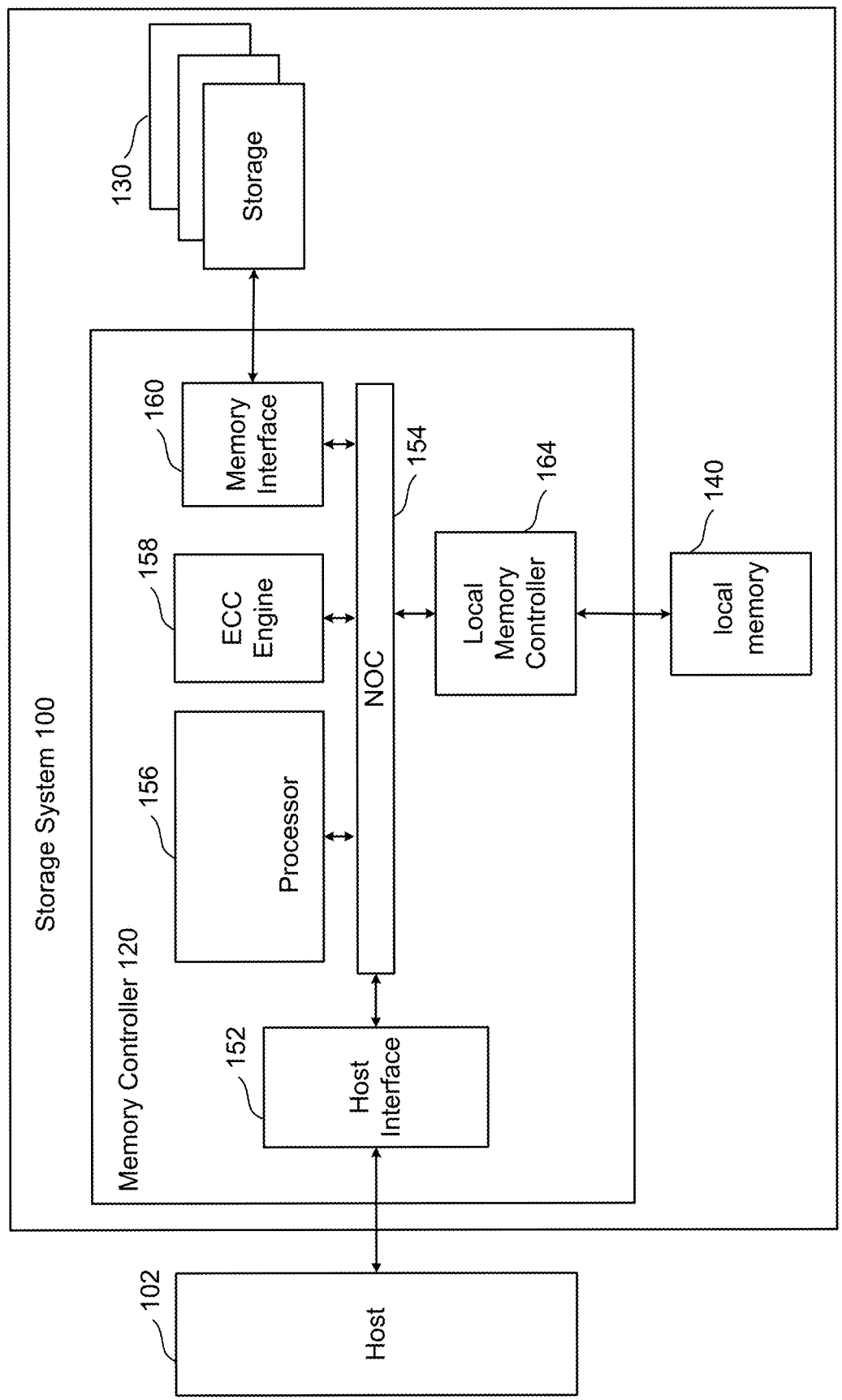
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
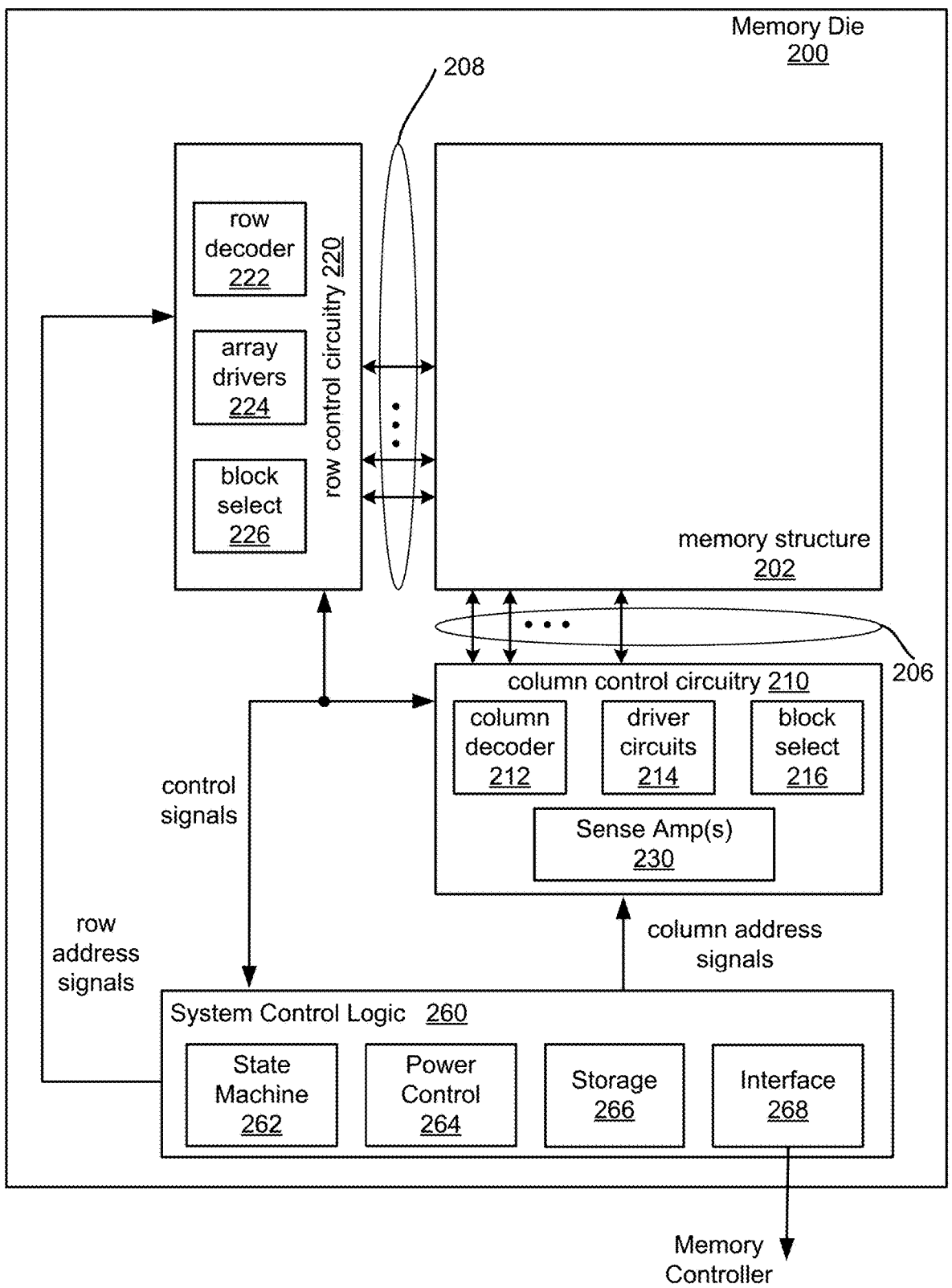
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and a regulator circuit for creating regulating voltages. Thus, power control module 264 may include one or more charge pumps. The charge pumps may provide operating voltages to control lines in the memory structure 202. In an embodiment, the state machine 262 controls the charge pumps as disclosed herein to regulate charge pump current during voltage ramp up. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
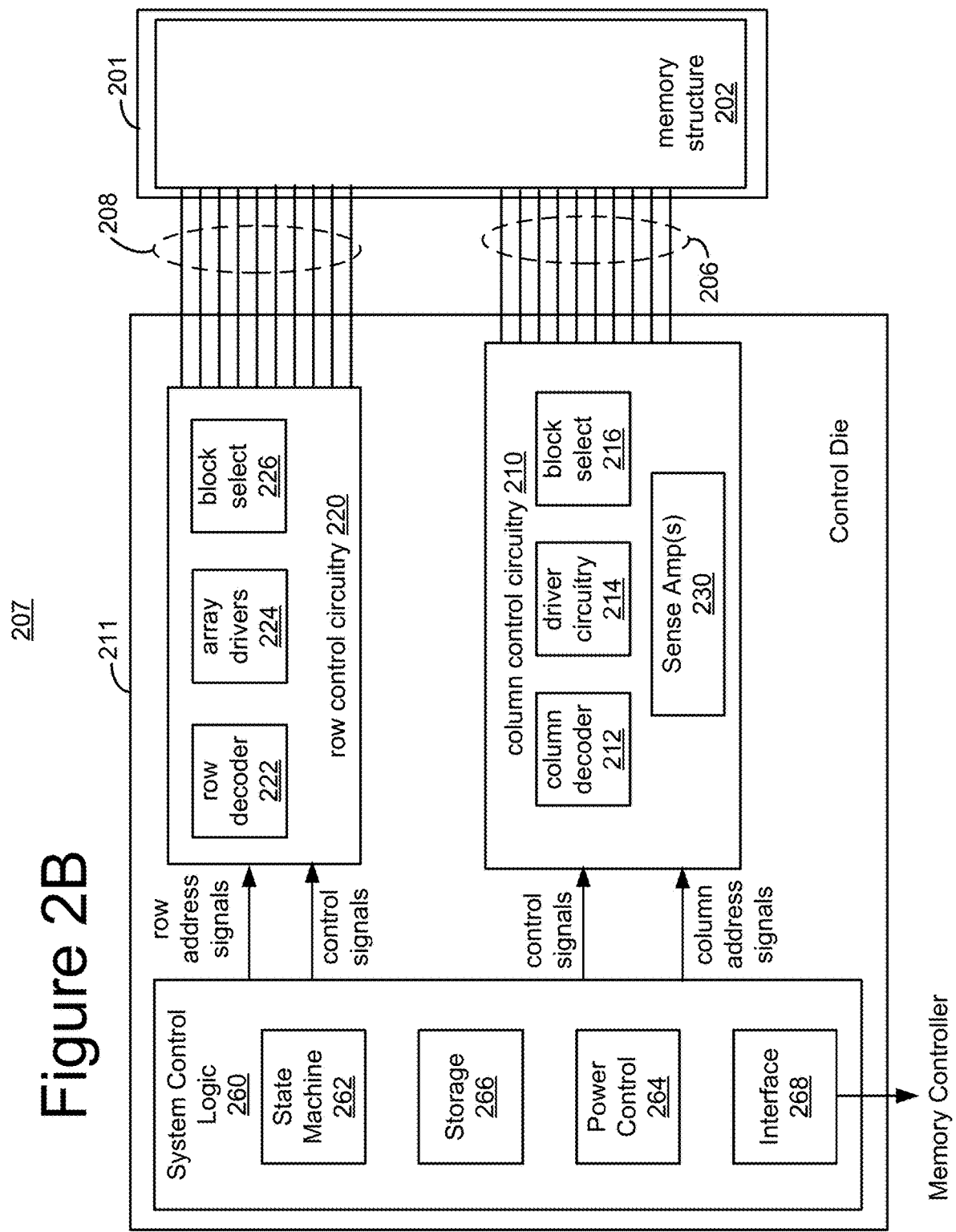
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, sense amps 230, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
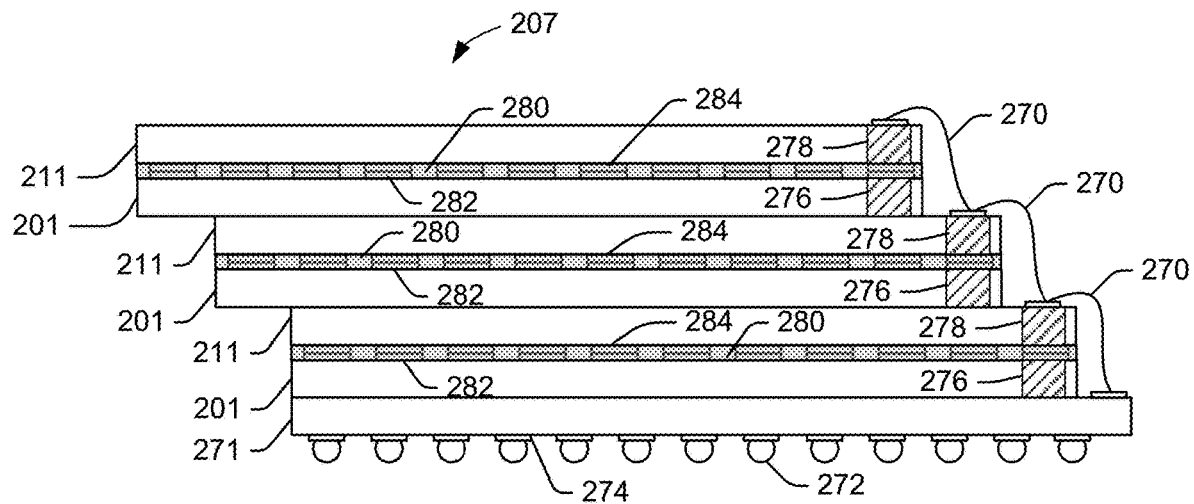
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
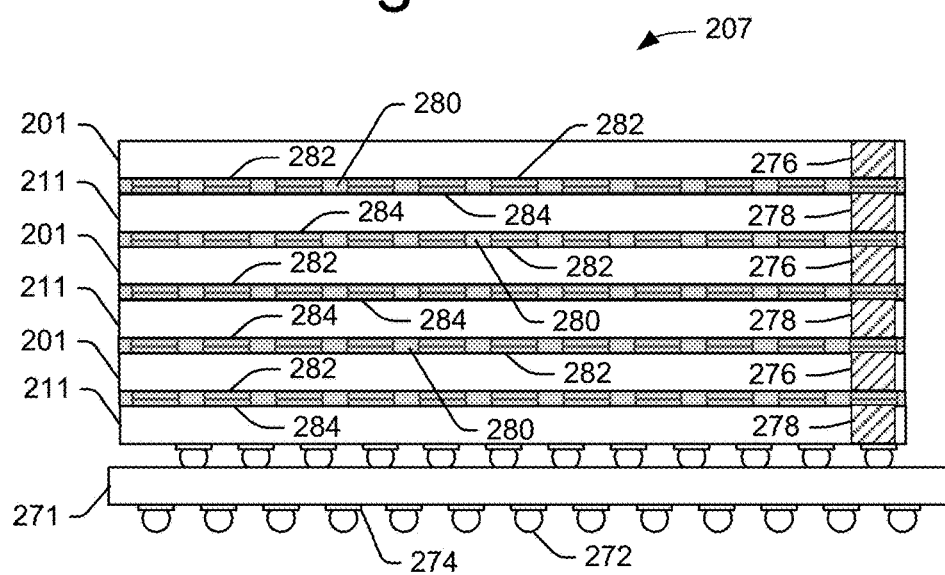

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
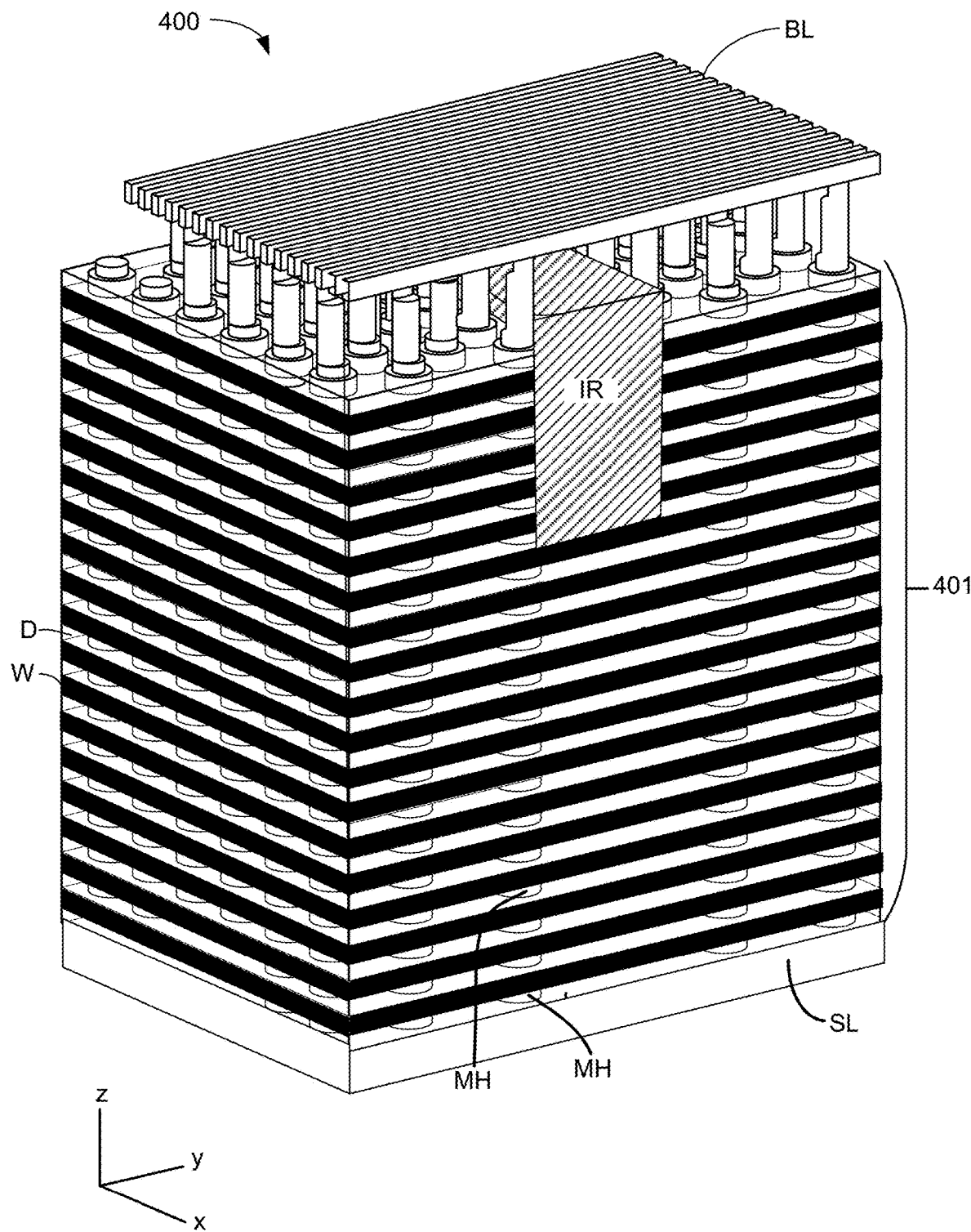
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
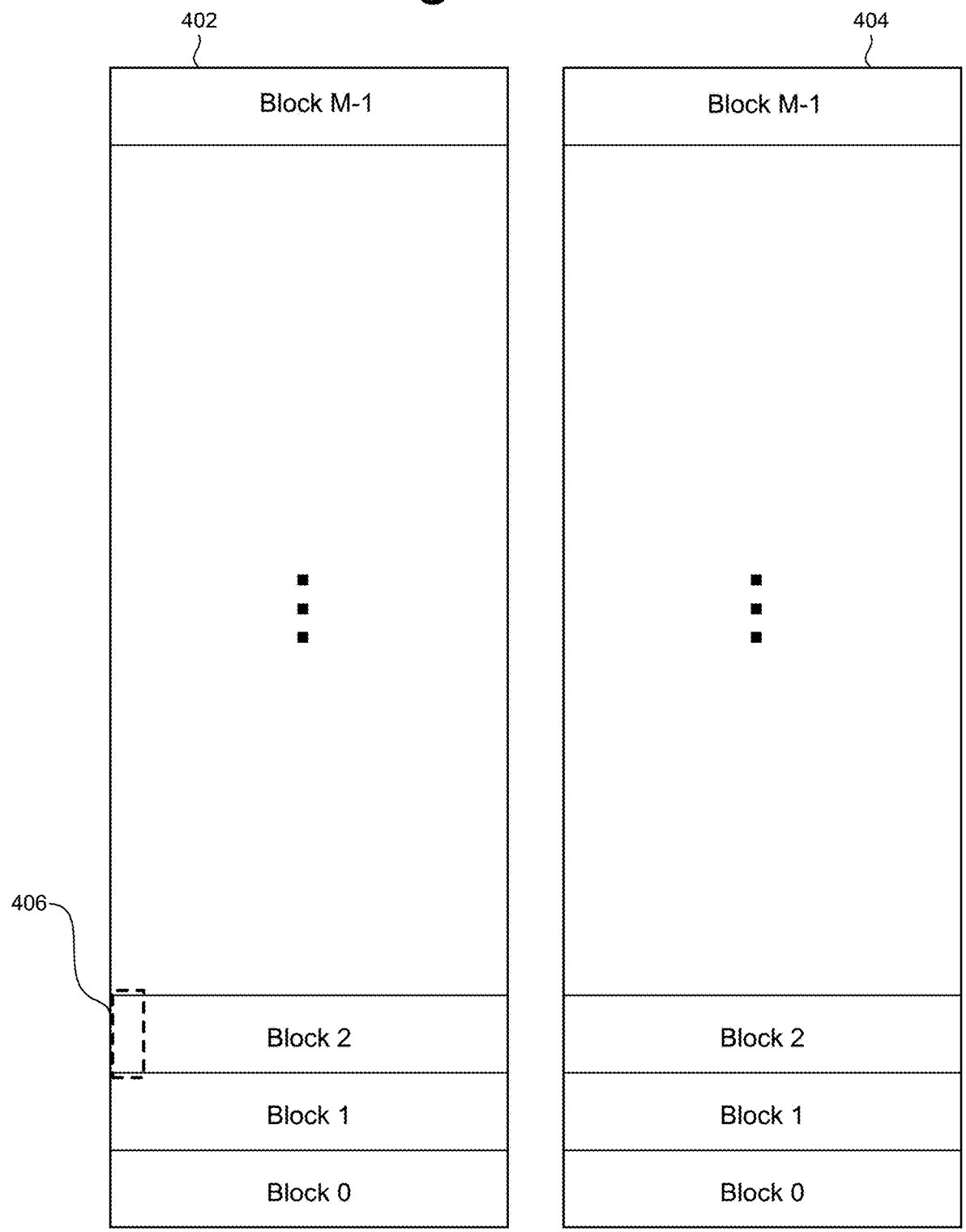
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or fewer than two planes can be implemented. In some embodiments, memory structure 202 includes four planes. In some embodiments, memory structure 202 includes eight planes. In some embodiments, programming can be performed in parallel in a first selected block in plane 402 and a second selected block in plane 404.

Figure 4B:
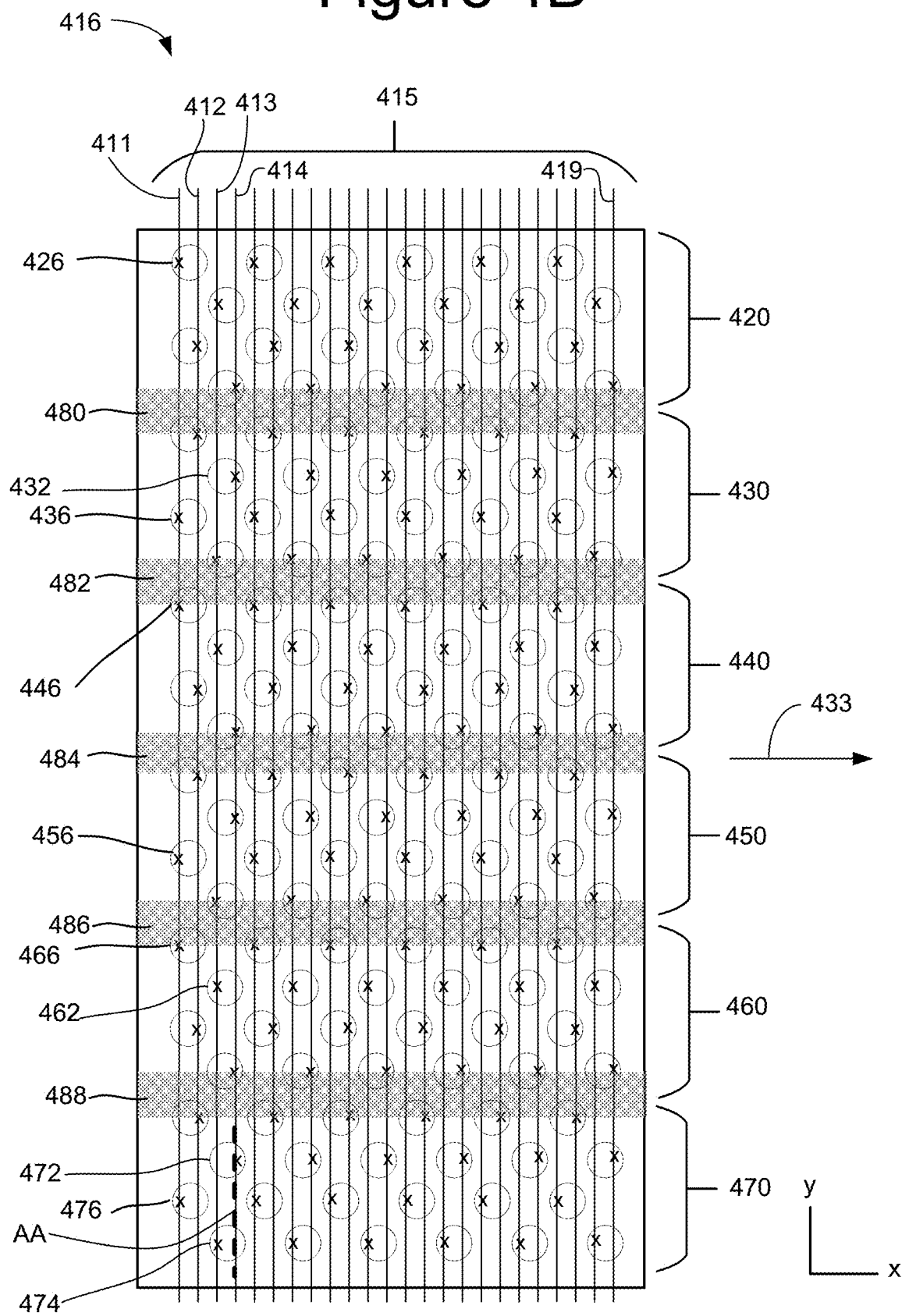
FIG. 4B is a block diagram depicting a top view of a portion of block of memory cells.
Figure 4D:
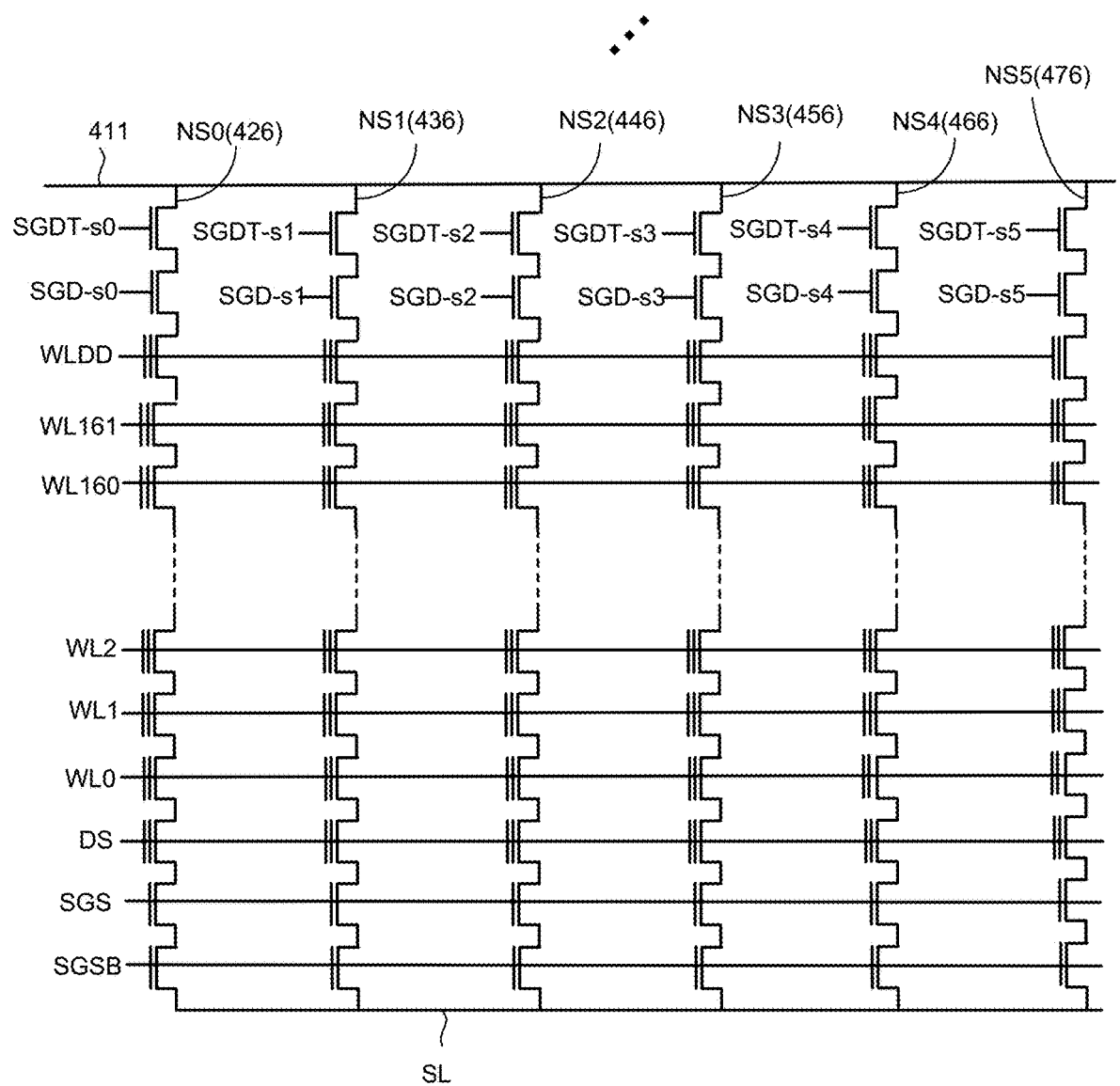
FIG. 4D is a schematic diagram of a portion of one embodiment of a block, depicting several NAND strings.

FIGS. 4B-4D depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. Each of the vertical columns also includes one or more dummy select transistors. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

FIG. 4B shows that the isolation regions 480, 482, 484, 486, 488 each cut into a portion of some of the memory holes. For example, isolation region 482 cuts into a portion of memory hole 446. Recall that the isolation region only goes down as far as the SGD layer. Select transistors are formed in the SGD layer.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). Vertical columns 472 and 474 are depicted protruding through the dummy drain side select layers, drain side select layers, dummy source side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4C show vertical column 472 connected to bit line 414 via connector 417.

For ease of reference, dummy drain side select layers, drain side select layers; dummy source side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL176. For example, dielectric layers DL166 is above word line layer WL159 and below word line layer WL160. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL. The stack in FIG. 4C is depicted as comprising one tier but can optionally include two or more tiers of alternating conductive and dielectric layers.

FIG. 4D is a schematic diagram of a portion of one embodiment of a block, depicting several NAND strings. FIG. 4D shows physical data word lines WL0-WL161 running across the entire block. The structure of FIG. 4D corresponds to a portion 416 in Block 1, Plane 1 of FIG. 4A, including bit line 411. Within the block, in one embodiment, each bit line is connected to six NAND strings. Thus, FIG. 4C shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4D as SGS. Although the select gates SGD-s0, SGD-s1, SGD-s2, SGD-s3, SGD-s4, and SGD-s5 are isolated from each other due to the isolation regions, the data word lines WL0-WL161 of each sub-block are connected together.

In one embodiment, SGDT0 and SGDT1 are connected together to operate as a single logical dummy select gate for each sub-block separated by isolation regions (480, 482, 484, 486 and 486) to form SGDT-s0, SGDT-s1, SGDT-s2, SGDT-s3, SGDT-s4, and SGDT-s5. SGSB0 and SGSB1 are also connected together to operate as a single logical dummy select gate that is represented in FIG. 4D as SGSB.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4D only shows the NAND strings connected to bit line 411. However, a full schematic of the block would show every bit line and six vertical NAND strings connected to each bit line.

Although the example memories of FIGS. 4-4D are three dimensional memory structure that includes vertical NAND strings with charge-trapping material, other (2D and 3D) memory structures can also be used with the technology described herein.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

FIG. 5A also depicts a read pass voltage Vread_SLC, which has a magnitude that is higher than the data state P. The read pass voltage will thus turn on a memory cell regardless of whether it is in the erase state (E) or the data state (P). In some embodiments, Vread_SLC is applied to unselected word lines during a read or program verify operation. FIG. 5B also depicts a read pass voltage Vread_MLC, which has a magnitude that is higher than the G data state. The read pass voltage Vread_MLC will thus turn on a memory cell regardless of which state it is in. In some embodiments, Vread_MLC is applied to unselected word lines during a read or program verify operation. Read pass voltages may also be used when programming memory cells to two bits per cell, four bits per cell, or another number of bits per cell. As defined herein a "read pass voltage" is a voltage that will turn on a memory cell transistor provided that the memory cell is not overprogrammed past the Vt distribution with the highest Vt.

In some embodiments, the memory system will regulate the charge pump current when ramping up a read pass voltage that is provided to unselected word lines during read or verify. Note that if the memory cells are programmed as depicted in FIG. 5B that as the read pass voltage ramps up more and more memory cells will be turned on. That is, early in the ramping the read pass voltage will be lower than the Vt of the data states with higher Vts. As the read pass voltage ramps up its magnitude will be able to turn on cells having the higher Vts. The turning on of the memory cells can change the load capacitance seen by the charge pump that supplies the read pass voltage. This change in the load capacitance can potentially lead to significant changes in charge pump current. However, in an embodiment, the memory system will regulate the charge pump current when ramping up the read pass voltage to keep the charge pump current more uniform. For example, the charge pump current may be regulated to be at or near a target current. Therefore, the charge pump current can be kept below a maximum allowed current. Also, at times the charge pump current can be regulated to go higher than it would otherwise go, which can increase the rate at which the output voltage ramps up.

However, the memory cells will not always be in the programmed state as depicted in FIG. 5B. Prior to programming the cells to the A-G states, all of the memory cells may be erased to the Er state. In some cases, the memory cells connected to an unselected word line will all be in the Er state. Thus, when applying the read pass voltage in such as case, all of the memory cells will turn on very early in the ramp up of Vread_MLC. This phenomena can change the load capacitance seen by the charge pump in a very different way than the example in which the memory cells are programmed to the A-G states. Therefore, the load capacitance seen by the charge pump may depend on whether the memory cells on the unselected word line have been programmed. In an embodiment, by the memory system regulating the charge pump current when ramping up the read pass voltage, the charge pump current is kept more uniform regardless of whether the memory cells have been programmed or not. For example, the charge pump current can be kept near a target current regardless of whether the memory cells have been programmed or not.

While the foregoing example discusses the three bit per cell example in FIG. 5B, regulating the charge pump current when ramping up a read pass voltage can be applied to other bit per cell cases. Also, regulating the charge pump current when ramping up a voltage is not limited to a read pass voltage or to a voltage on an unselected word line. In some embodiments, the voltage is applied to a selected word line. In some embodiments, the voltage is applied to a control line such as a select line.

Figure 6C:
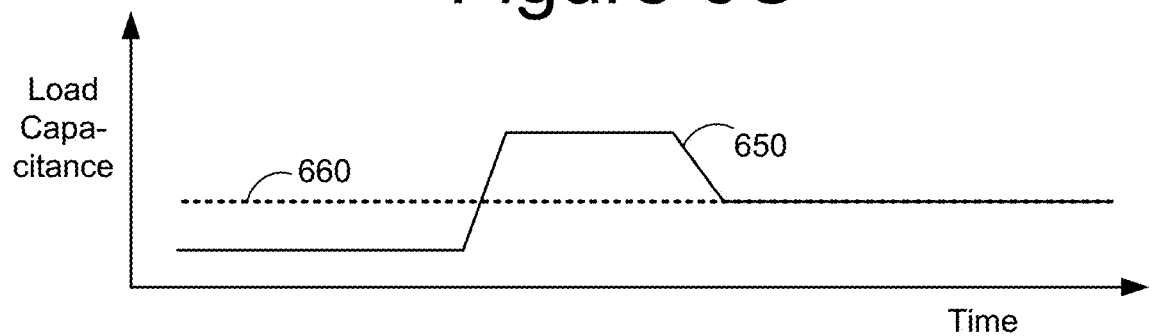

FIGS. 6A-6C are graphs that illustrate output voltage, current, and load capacitance in a conventional ramping up of a charge pump. Two different example load capacitances are considered. The example presented above in which the load capacitance will depend on whether or not the memory cells on the unselected word line are programmed will be discussed for purpose of illustration. Plot 610 in FIG. 6A depicts the ramp up of the output voltage. In this conventional example the voltage ramps up at about the same rate regardless of the whether or not the memory cells on the unselected word line are programmed. However, the ramp rate may change as the voltage is ramping up, as indicated by the changes in the slope of plot 610.

FIG. 6B depicts charge pump current versus time during ramp up for the two cases. Plot 630 is for the case in which the memory cells on the unselected word line are programmed. Plot 640 is for the case in which the memory cells on the unselected word line are all in the erased state. Note that for the erase state example, plot 640 has a spike in current while the pump output voltage is still fairly low, consistent with the low Vt of the memory cells. However, for the programmed state example, plot 630 has a much lower current early on, followed by a very large spike. The large spike can potentially exceed a maximum allowed current 620. Plot 630 briefly exceeds the Max Icc 620, which is a violation of the maximum allowed specification. This is to demonstrate a potential specification violation. As will be discussed below, the slope of plot 610 (see FIG. 6A) may be controlled to avoid such violations. However, this comes at the expense of slowing the ramp rate for all cases (erased or programmed).

FIG. 6C shows load capacitance versus time for the two cases. Plot 650 is for the programmed example. Plot 660 is for the erased example. Significantly, the load capacitance of plot 650 is different from plot 660, which contributes to the different shapes of the current plots 630, 640 in FIG. 6B. Also, the load capacitance of an individual case may change over time during the ramp up, which can contribute to uneven current depicted in, for example, plot 630 in FIG. 6B.

In some conventional techniques the slope of plot 610 (see FIG. 6A) is controlled in order to keep the charge pump input current below the Max Icc 620. In some conventional techniques, the slope of plot 610 will be substantially the same for both cases (e.g., programmed and erased). However, the peak Icc occurs at different output voltages for the two cases. When plot 640 is at its peak Icc, plot 630 is well below the Max Icc 620. Thus, if more current were allotted at that output voltage to the programmed case (plot 630), then the output voltage could ramp up faster for that region. Furthermore, when plot 630 is at its peak Icc, plot 640 is well below the Max Icc 620. Thus, if more current were allotted at that output voltage to the erased case (plot 640), then the output voltage could ramp up faster. Thus, if the slope of the output voltage (plot 610) is controlled to keep the peak Icc below Max Icc 620, then neither case takes full advantage of the maximum allotted Icc throughout ramp up. Referring back to plot 610, note that the slope of plot 610 decreases when plot 630 is at its peak Icc in order to reduce the peak Icc for plot 630.

Figure 7A:
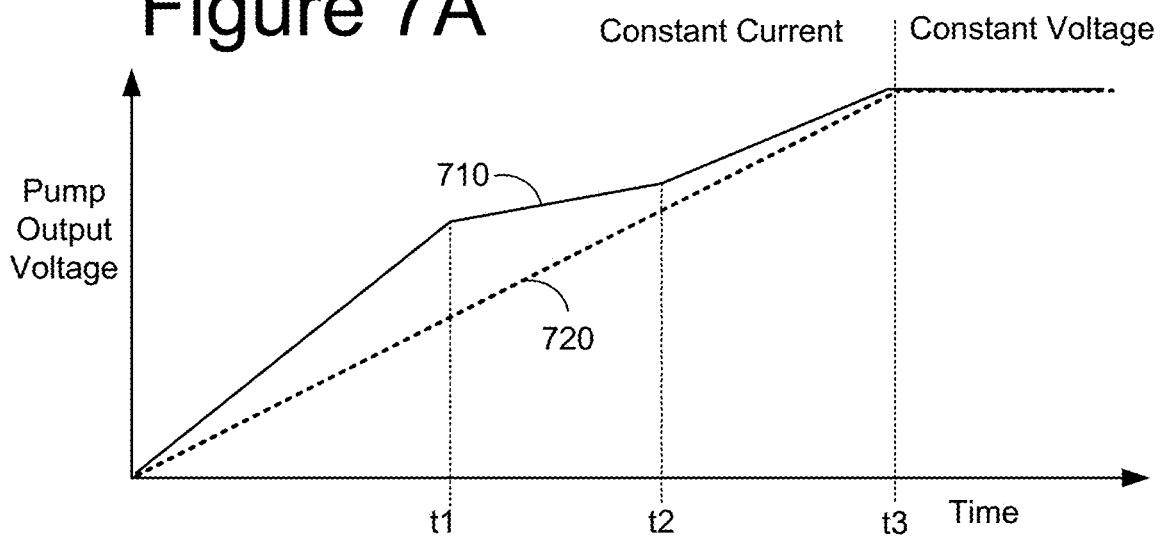
FIGS. 7A-7C are graphs that illustrate output voltage, current, and load capacitance in an embodiment of a memory system that regulates current when ramping up a charge pump output voltage.
Figure 7B:
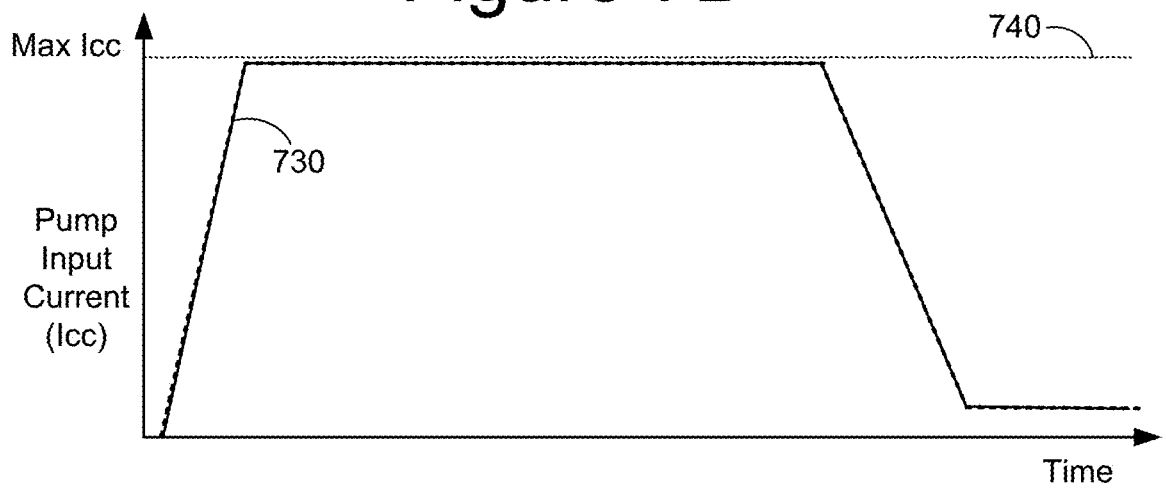
Figure 7C:
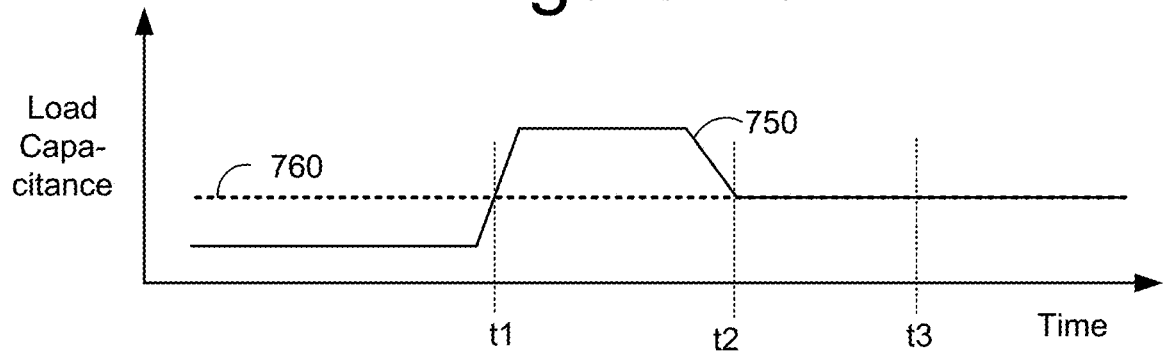

FIGS. 7A-7C are graphs that illustrate output voltage, current, and load capacitance in an embodiment of a memory system that regulates current when ramping up a charge pump output voltage. In an embodiment, the output voltage is provided to a control line in a memory structure. In one embodiment, the control line is an unselected word line. In one embodiment, the output voltage is a read pass voltage. Two different example charge pump load capacitances are considered. The example presented above in which the load capacitance will depend on whether or not the memory cells on the unselected word line are programmed will be discussed for purpose of illustration.

Plot 710 in FIG. 7A depicts the ramp up of the output voltage for the case in which the memory cells are programmed. Plot 720 in FIG. 7A depicts the ramp up of the output voltage for the case in which the memory cells are in the erased state. FIG. 7A has a region labeled "Constant Current" and a region labeled "Constant Voltage". The Constant Current region corresponds to the time period while the output voltage ramps up (prior to t3). The Constant Voltage region corresponds to the time period after the output voltage ramps up and is at regulated at a constant voltage (after t3). During the Constant Current period the charge pump input current is regulated to a target current. During the Constant Current period the charge pump output voltage is regulated to a target voltage. In an embodiment, the memory system generates a clock signal that has a random duty cycle while the voltage is ramping up. A clock that is based on the random duty cycle clock may be provided to the clock input of the charge pump to regulate the input current to at or near the target current. Further details of the random duty cycle clock will be discussed below.

FIG. 7B depicts pump current versus time during ramp up for an embodiment of the two cases. In this example, the charge pump current is substantially the same for the two cases, as indicated by plot 730. However, there may be some difference between the current for the two cases. Plot 730 shows that the current quickly increases to close to the maximum allow current 740. However the current is regulated to not exceed the maximum allowed current (Max Icc) 740. Moreover, the current stays close to the maximum allowed current 740 for much of the time while the output voltage is ramping up, which provides for a fast ramp up of the output voltage.

FIG. 7C shows load capacitance versus time for an embodiment of the two cases. Plot 750 is for the programmed example and shows considerable variance in load capacitance over time. Plot 760 is for the erased example. Although plot 760 does not show a substantial change in load capacitance over time, there may be some change in load capacitance over time for the erased case as well. However, despite the differences in load capacitance between plot 750 and 760, the charge pump input current is substantially the same in FIG. 7B for the two cases. Also, despite the change in load capacitance over time for, for example, plot 750, the charge pump input current is substantially constant for much of the ramp up time (see plot 730 in FIG. 7B). Note that there could be some variation in the current due to, for example, changing a target duty cycle a limited number of times. The change of the target duty cycle will be discussed in more detail below.

Referring back to FIG. 7A, plot 710 shows that that output voltage for the programmed case initially (prior to t1) ramps up more quickly than for plot 720 (erased case), which is due to the smaller initial load capacitance for the programmed case (plot 750) than the erased case (plot 760). However, between t1 and t2 when the load capacitance for the programmed case (plot 750) is greater than the load capacitance for the erased case (plot 760) the output voltage ramps up more slowly for the programmed case (plot 710) than for the erased case (plot 720).

Figure 8:
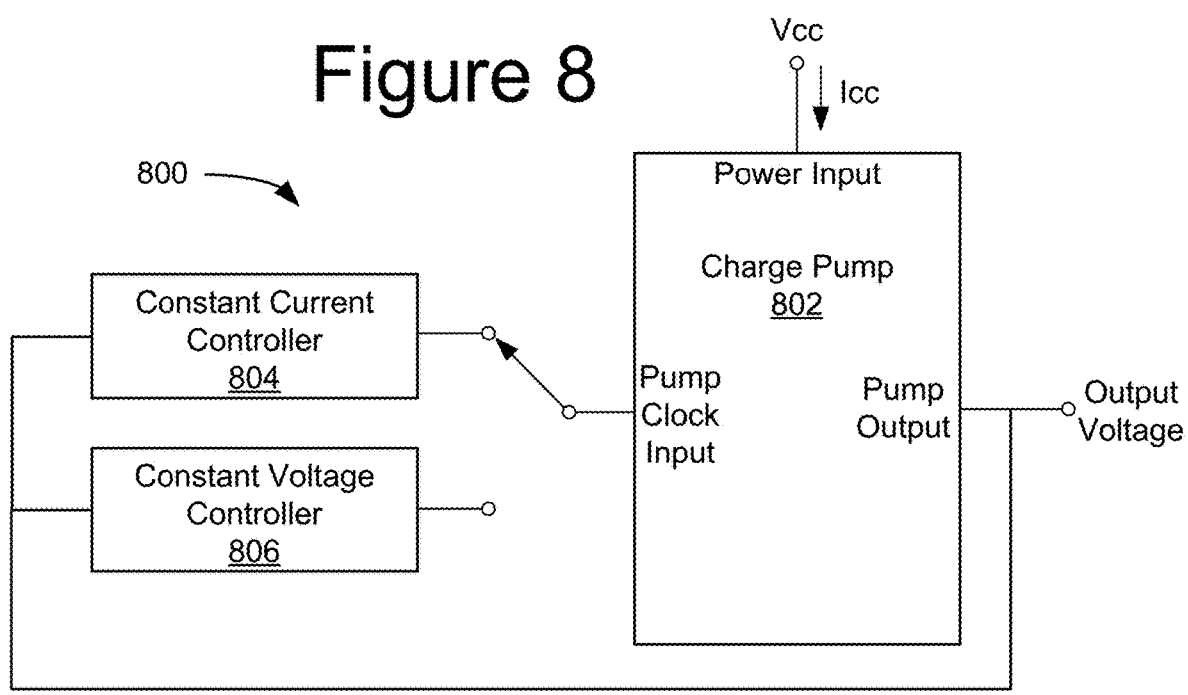
FIG. 8 depicts a block diagram of one embodiment of a charge pump regulation system.

FIG. 8 depicts a block diagram of one embodiment of a charge pump regulation system 800. The regulation system 800 has a charge pump 802, a constant current controller 804 and a constant voltage controller 806. The charge pump 802 has a clock input that inputs a clock signal. The charge pump 802 has a pump output that outputs an output voltage. The charge pump 802 has a power input that receive a power supply voltage Vcc. The power input also receives a pump input current, referred to as Icc. The charge pump 802 may be a switching voltage convertor that changes the input voltage (Vcc) to a different voltage, which is provided at the pump output (output voltage). The clock input receives a switching signal (referred to a pump clock). The charge pump 802 may contain one or storage elements such as capacitors, and may contain a number of pump stages. A capacitor may repeatedly transfer charge from an input node to an output node according to the pump clock. The pump clock may be used to control the opening and the closing of switches (e.g., switching transistors) that transfer the charge. For example, a stage may contain a capacitor. A top plate of the capacitor may be connectable to a stage input voltage (possibly from a previous stage). The top plate of the capacitor may also be connectable to a stage output voltage (possibly to a next stage). During a charging phase the stage input voltage may be connected to the top plate of the capacitor to charge the capacitor, while the top plate of the capacitor is disconnected from the stage output. During a boosting phase the stage input voltage may be disconnected from the top plate of the capacitor while the top plate of the capacitor is connected to the output of the stage. In one technique the bottom plate of the capacitor is connected to ground during the charging phase and is connected to Vcc during the boosting phase. The pump clock may control the switches and hence when the boosting and charging phases occur. Therefore, the charge pump 802 generates an output voltage that depends on the pump clock. The various charge pump stages may be connected in series or parallel. Further details of charge pumps are described in U.S. Pat. No. 9,479,050, entitled "High-Efficiency Fractional Pump," which is hereby incorporated by reference.

There will typically be a limit to how large Icc is allowed to be. With reference back to FIG. 7B, the limit on Icc is the dashed line 740 (Max Icc). In an embodiment, the constant current controller 804 regulates Icc while the output voltage is ramping up. For example, the constant current controller 804 may regulate Icc to hold Icc at or near a target Icc. In an embodiment, the constant current controller 804 generates a random duty cycle clock signal to regulate Icc. FIG. 8 depicts the output voltage being fed back to the constant current controller 804. In an embodiment, the constant current controller 804 controls the average duty cycle of the random duty cycle clock signal based on the magnitude of the output voltage. Based on the random duty cycle clock signal, the constant current controller 804 provides a pump clock to the pump clock input. In an embodiment, the constant current controller 804 inputs a constant frequency clock signal, which is either passed or blocked by the random duty cycle clock signal in order to create the pump clock. Thus, as the output voltage ramps up the constant current controller 804 may regulate Icc based on the magnitude of the output voltage.

In an embodiment, the constant voltage controller 806 regulates the output voltage after the output voltage has ramped up to a threshold voltage. For example, the constant voltage controller 806 may regulate the output voltage to hold the output voltage at or near a target voltage. The constant voltage controller 806 receives the output voltage and sends a pump clock based thereon to the pump clock input. In an embodiment, the constant current controller 804 inputs the constant frequency clock signal, which is either passed or blocked based on whether the present value of the charge pump output voltage is above or below a target voltage. Therefore, the constant voltage controller 806 regulates the output voltage to a target voltage. Thus, the memory system will select the constant current controller 804 while the output voltage is ramping up and select the constant voltage controller 806 after the output voltage has ramped up to the threshold voltage. The threshold voltage could be equal to the final target voltage, or may be somewhat less than the final target voltage.

Figure 9:
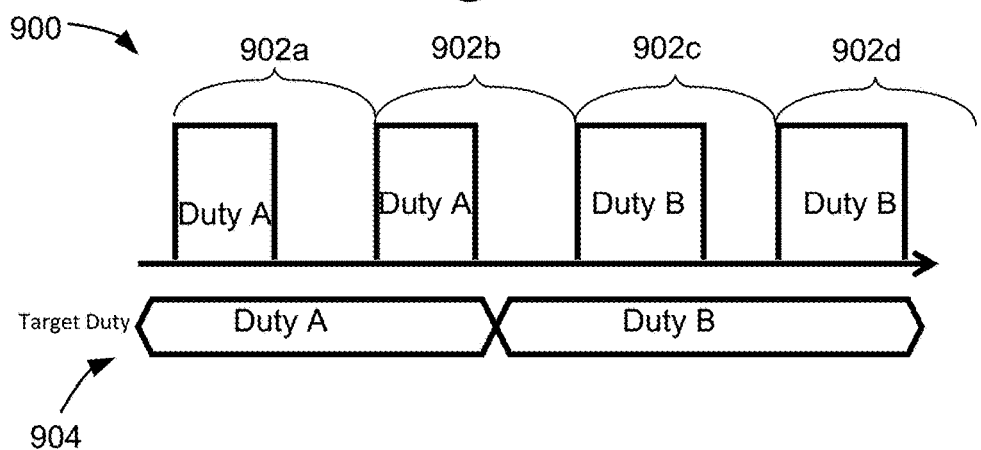
FIG. 9 depicts an example of a periodic clock signal.

FIG. 9 depicts an example of a periodic clock signal 900. The periodic clock has a high state and a low state (e.g., high voltage and low voltage). For brevity, the clock will be referred to as either being "high" or "low." The clock alternates between being high and low, with a cycle (or period) 902 being defined as one high state and one low state (by convention herein, the cycle will be defined as starting when the clock transitions to the high state). The periodic clock has a duty cycle, which is defined as the ratio of the time for which the clock is high to the time that the clock is low each cycle 902. FIG. 9 shows a target duty cycle 904 below the clock 900. From time to time, the target duty cycle may change. The target duty cycle is initially Duty cycle A but then changes to Duty cycle B (which is a different percentage than Duty cycle A). The clock 900 shows that for cycle 902a the clock has Duty cycle A, for cycle 902b the clock has Duty cycle A, for cycle 902c the clock has Duty cycle B, and for cycle 902d the clock has Duty cycle B. The clock 900 is defined as being periodic because once a target duty cycle is established, the duty cycle repeats each cycle. That is, the amount of time that the clock is high is substantially the same each cycle. For example, the duty cycle for period 902b is the same as the duty cycle for period 902a. Likewise, the duty cycle for period 902d is the same as the duty cycle for period 902b. In practice, there will be some variation in the duty cycle from cycle to cycle due to non-ideal factors. However, the goal is for the clock 900 to have the target duty cycle each period.

Figure 10:
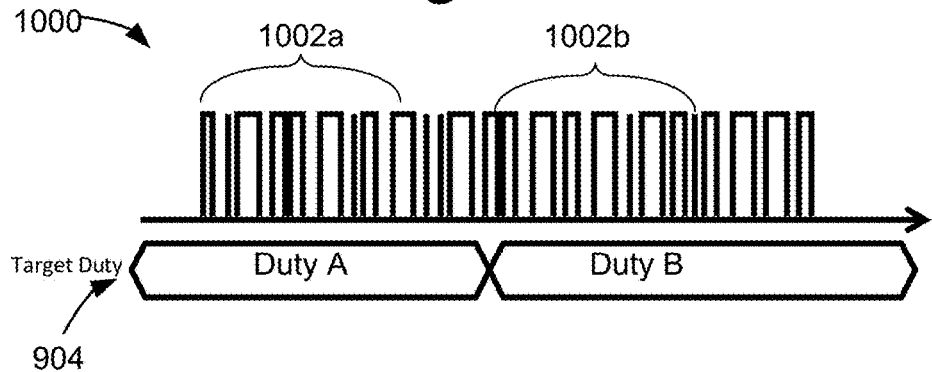
FIG. 10 depicts a random duty cycle clock signal that is generated by an embodiment of the constant current controller.

FIG. 10 depicts a random duty cycle clock signal that is generated by an embodiment of the constant current controller 804. The random duty cycle clock 1000 has a high state and a low state (e.g., high voltage and low voltage). The random duty cycle clock 1000 alternates between being a high state (e.g., high voltage) and a low state (e.g., low voltage) each cycle. The same target duty cycles 904 (Duty cycle A, Duty cycle B) that were discussed in connection with the period clock 900 are depicted below the random duty cycle clock 1000. However, unlike the periodic clock 900 the random duty cycle clock 1000 does not have the target duty cycle each period. However, within a time window 1002, the random duty cycle clock 1000 will be in the high state and the low state for an amount of time that meets the target duty cycle. For ease of discussion time window 1002a corresponds to period 902a in FIG. 9. In time window 1002a the random duty cycle clock 1000 will be high for the same amount of time as the periodic clock 900 is high during period 902a. However, during a given time window 1002 there is substantial variation in the duty cycle from one cycle to the next. In an embodiment, there is random variation in the duty cycle from one cycle to the next within a time window 1002a. However, over the time window 1002, the random duty cycle clock 1000 has the target duty cycle. In one embodiment, the random duty cycle clock signal 1000 is used to either pass or block a constant frequency clock signal in order to create a pump clock.

As with the periodic clock 900, the target duty cycle may change. The same transition from duty cycle A to duty cycle B that was discussed in connection with the periodic clock 900 is depicted in FIG. 10. Time window 1002b begins at the transition from Duty cycle A to Duty cycle B. As with time window 1002a, the random duty cycle clock 1000 will be high during time window 1002b for an amount of time to comply to meet the target Duty cycle B. Note that the random duty cycle clock 1000 can quickly transition to the new target duty cycle. However, due to the long time for which the periodic clock 900 is high each cycle, the periodic clock 900 may be slow to respond to the change in duty cycle. Also, note that the periodic clock 900 stays at the high state for long period of time relative to the amount of time that the random duty cycle clock 1000 stays in the high state. The shorter time in the high state can help the random duty cycle clock 1000 to better regulate Icc of the charge pump than the periodic clock 900.

In some embodiments, the target duty cycle for the random duty cycle clock 1000 is based on the magnitude of the charge pump output voltage. In an embodiment, the target duty cycle is based on an analysis of charge pump input current versus output voltage. FIG. 11 is a graph depicting an example charge pump input current (Icc) versus charge pump output voltage. Plot 1102 depicts the pump input current (Icc) as a function of the charge pump output voltage. Plot 1102 corresponds to running the charge pump at a 100 percent duty cycle. The shape of plot 1102 will depend on the physical characteristics of the charge pump. The Icc versus output voltage relationship may be determined experimentally on an actual charge pump or by simulation with circuit analysis software.

Once the Icc versus output voltage relationship is determined for the charge pump that is to be used in the memory system, a relationship between target duty cycle and output voltage may be determined, based on a target Icc. FIG. 12 depicts a plot 1202 of target duty cycle versus charge pump output voltage. The plot 1202 is for a target Icc, which may be the Max Icc (see FIG. 7B) or some other target. The target Icc is the target to which Icc is regulated when the output voltage is ramping up and the random duty cycle clock 1000 is generated. For example, when the output voltage is at V1 the target duty cycle should be D1 in order to regulate Icc to the target Icc. When the output voltage is at V2 the target duty cycle should be D2 in order to regulate Icc to the target Icc. Note that the shape of plot 1202 can vary depending on the physical characteristics of the charge pump 802. One technique for determining the shape of plot 1202 is to back-calculate the target duty cycle based on scaling the current in plot 1102. As noted above, plot 1102 corresponds to running the charge pump at a 100 percent duty cycle. The current (Icc) will be reduced when the duty cycle is reduced. For example, reducing the duty cycle by a certain percentage may reduce Icc by the same percentage. If the Icc does not exceed the target Icc for a given voltage even at 100 percent duty, then the target duty can be set to 100 percent. Therefore, the target duty cycle may be back-calculated based on plot 610 and the target Icc.

In one embodiment, the plot 1202 is used to produce a lookup table. FIG. 13 is an embodiment of a table 1300 that maps output voltage to target duty cycle for the random duty cycle clock 1000. In this example, each table entry covers a range of output voltage and specifies a target duty cycle for that range. The table 1300 can have any level of granularity that is desired. Thus, the output voltage range could be more or less than the one volt range in the example in table 1300. The degree to which the input current of the charge pump is substantially current may depend in part on the number of times that the target duty cycle is changed. Thus, when it is stated that the input current of the charge pump is regulated to be "substantially constant" this means that there may be some change in the input current during the time period in which the target duty cycle remains the same. However, the target duty cycle will be changed as the charge pump output voltage changes in order to regulate the charge pump input current to at or near the same target current.

The lookup table 1300 is a data structure that is stored in non-transitory memory (volatile or non-volatile). The lookup table 1300 may be stored in the memory structure 202 and copied to storage 266 (see FIGS. 2A, 2B) when the memory system is powered on. Instead of using a lookup table, the plot 1202 in FIG. 12 could be characterized as an equation such that the target duty cycle may be calculated using the equation. For example, in some embodiments, the system control logic 260 contains a micro-processor that may perform the calculation.

Figure 14:
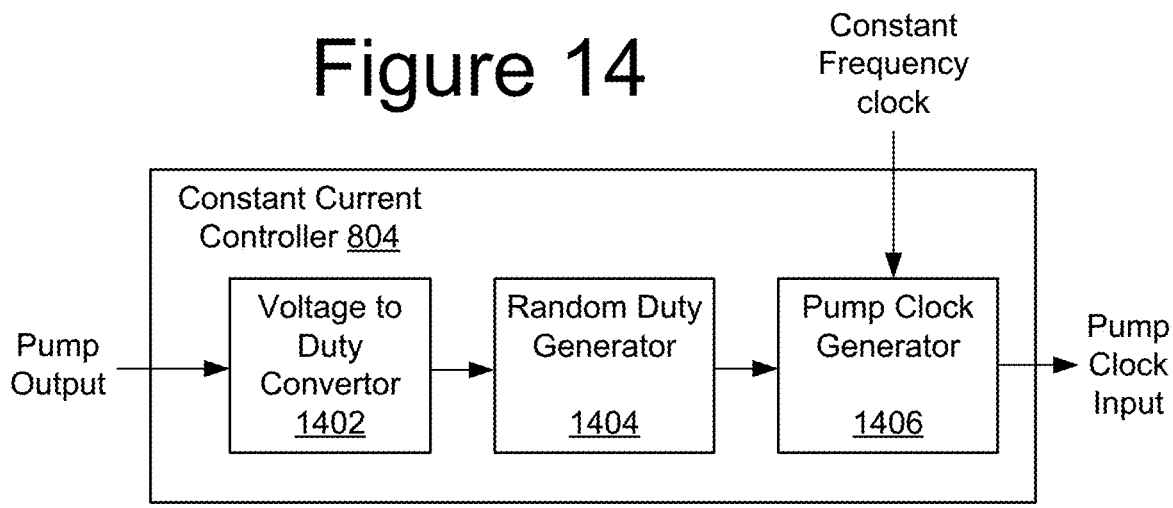
FIG. 14 is a block diagram depicting further details of one embodiment of the constant current controller.

FIG. 14 is a block diagram depicting further details of one embodiment of the constant current controller 804. The constant current controller 804 inputs a signal from the charge pump output that is indicative of the charge pump output. In an embodiment, this signal is indicative of the magnitude of the output voltage. In one embodiment, the signal is a flag that indicates that the output voltage has entered a new voltage range. For example, with reference to the table 1300 in FIG. 13, each time that the charge pump output enters a new voltage range the flag signal may go high to indicate this transition.

The voltage to duty cycle converter 1402 converts the charge pump output voltage to a target duty cycle. In one embodiment, the voltage to duty cycle converter 1402 accesses a voltage to duty cycle table such as the example table 1300 in FIG. 13. As one example, each time that the flag input goes high, the voltage to duty cycle converter 1402 changes the duty cycle to the percentage in the next row in the table 1300. However, the voltage to duty cycle converter 1402 is not required to use a lookup table. In one embodiment, the voltage to duty cycle converter 1402 performs a calculation based on an equation that characterizes the target duty cycle to voltage relationship (such as an equation that characterizes plot 1202 in FIG. 12). The voltage to duty cycle converter 1402 provides a target duty cycle to the random duty cycle generator 1404. The random duty cycle generator 1404 generates the random duty cycle clock 1000.

The pump clock generator 1406 generates the pump clock based on the random duty cycle clock 1000. In one embodiment, the pump clock generator 1406 inputs a constant frequency clock signal, which is either passed or blocked by the random duty cycle clock 1000 in order to create the pump clock. For example, the constant frequency clock signal is passed when the random duty cycle clock signal has a high state and blocked when the random duty cycle clock signal has a low state.

Figure 15:
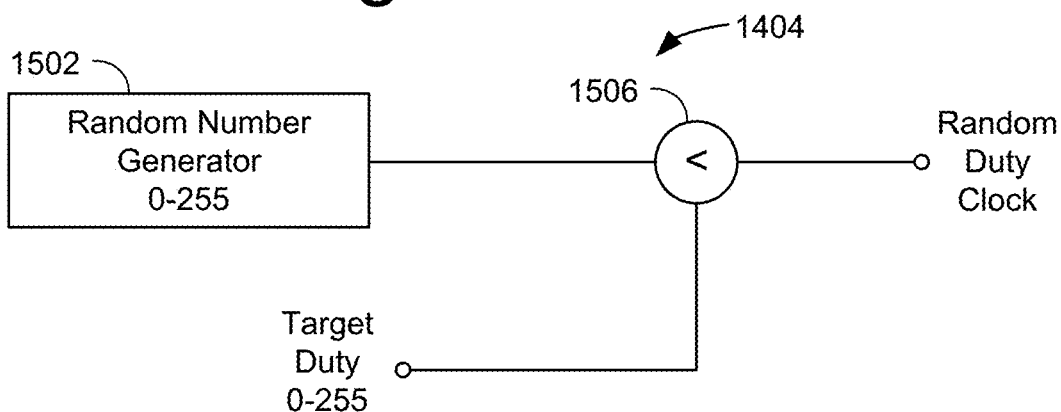
FIG. 15 depicts a block diagram of one embodiment of the random duty cycle generator, which has a random number generator.

FIG. 15 depicts a block diagram of one embodiment of the random duty cycle generator 1404, which generates the random duty cycle clock 1000. The random duty cycle generator 1404 has a random number generator 1502, which randomly generates numbers between 0-255 at a high frequency. The target duty cycle, which may be provided by the voltage to duty cycle converter 1402, also has a range between 0-255. A range other than between 0-255 may be used. The comparator 1506 determines whether the random number is less than the target duty cycle. If the random number is less than the target duty cycle, then the random duty cycle clock 1000 will be high. If the random number is greater than or equal to the target duty cycle, then the random duty cycle clock 1000 will be low.

Figure 16:
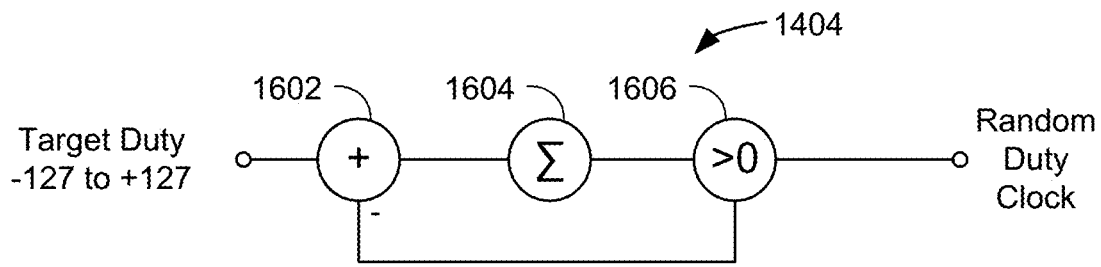
FIG. 16 depicts a block diagram of an embodiment of the random duty cycle generator, which includes delta-sigma based duty cycle generator.

FIG. 16 depicts a block diagram of another embodiment of the random duty cycle generator 1404, which generates the random duty cycle clock 1000. The random duty cycle generator 1404 in FIG. 16 is a delta-sigma based duty cycle generator. The target duty cycle, which may be provided by the voltage to duty cycle converter 1402, has a range between −127 to +127 in this example. A range other than between −127 to +127 may be used. The delta-sigma based duty cycle generator has an adder 1602, a register 1604 and a comparator 1606. The adder 1602 and register 1604 may work as an integrator that accumulates the difference of the input and the output.

Figure 17:
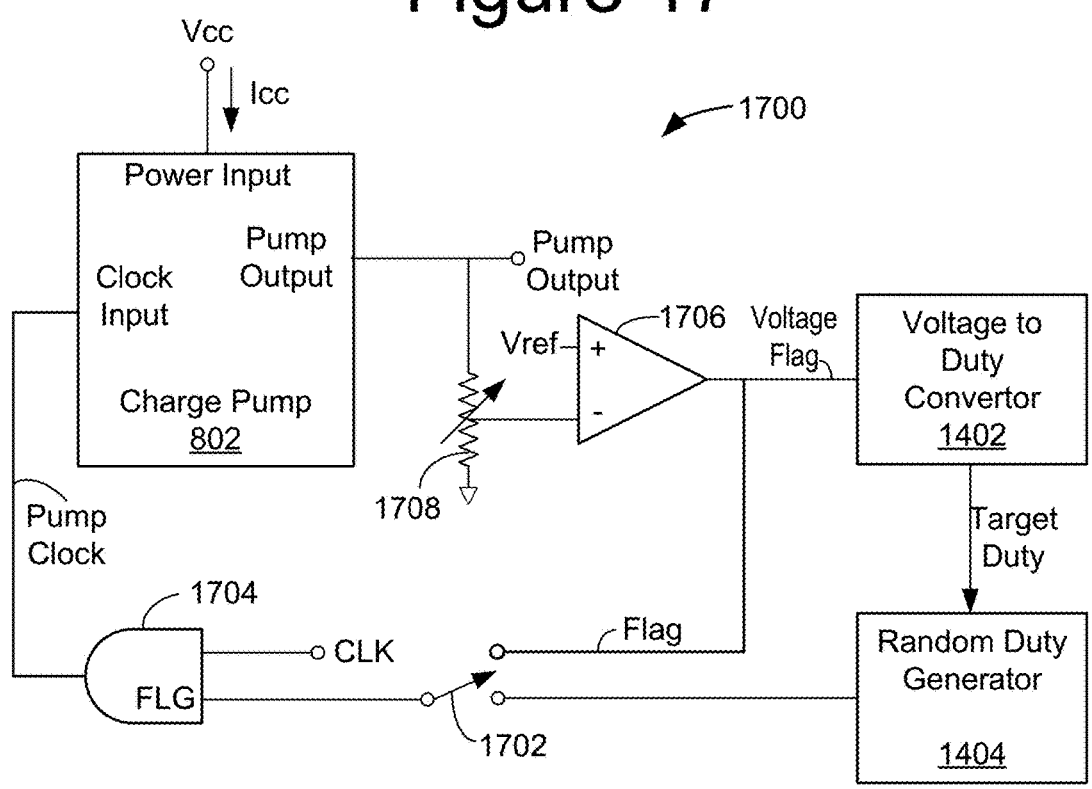
FIG. 17 is a diagram of one embodiment of a voltage regulator.

FIG. 17 is a diagram of one embodiment of a voltage regulator 1700. FIG. 17 depicts one embodiment of how components of the constant current controller 804 can be integrated with the charge pump 802, along with other elements that regulate the output voltage when the constant current controller 804 is not in use.

Switch 1702 is used to connect the random duty cycle generator 1404 to the FLG input of the AND gate 1704 when in constant current regulation mode. Switch 1702 is used to connect the output of comparator 1706 to the FLG input of the AND gate 1704 when in constant voltage regulation mode. The pump output is connected to the inverting input of the comparator 1706 by way of variable resistor 1708. The non-inverting input of the comparator 1706 receives a reference voltage (Vref). In an embodiment, the resistance of the variable resistor 1708 is used to establish the target voltage. Thus Vref can stay the same with the resistance of the variable resistor 1708 being modified to establish the target voltage for comparison purposes. Thus, during constant voltage regulation, the comparator output may be referred to as a flag that has a high state when the pump output voltage is less than a target voltage and has a low state when the pump output voltage is greater than the target voltage. For purpose of discussion, when in constant current regulation mode the output from the comparator 1706 is referred to as a Voltage Flag and is provided to the constant current controller 804. When in constant voltage regulation mode the output from the comparator 1706 is referred to as Flag and is provided to the FLG input of the AND gate 1704.

Figure 18:
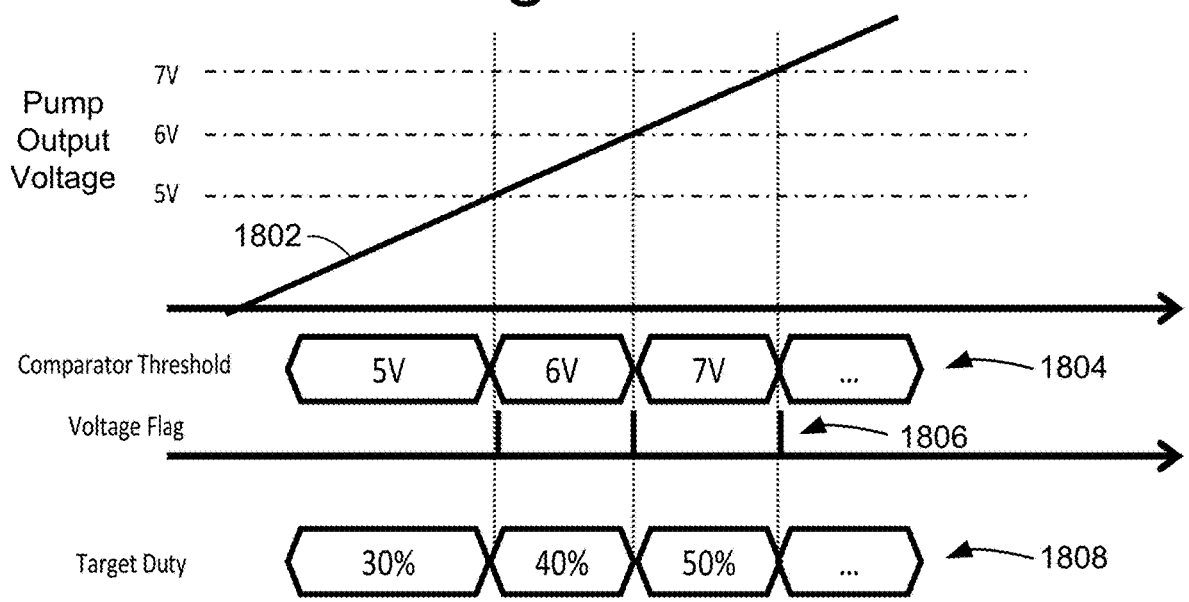
FIG. 18 depicts example signals and parameters to facilitate explanation of operation of an embodiment of the regulator when in current regulation mode.

As noted, in the constant current regulation mode the output of the comparator 1706 is connected to the voltage to duty cycle converter 1402 in order to provide a voltage flag to indicate what range the output voltage is in. FIG. 18 depicts example signals and parameters to facilitate explanation of operation of an embodiment of the regulator 1700 when in current regulation mode. Plot 1802 depicts the output voltage of charge pump 802 ramping up. Comparator threshold voltages 1804 of 5V, 6V, and 7V are depicted. The starting point for analysis in FIG. 18 is for the charge pump output voltage being below 5V. This corresponds to a target duty cycle 1808 of 30% in this example. The voltage to duty cycle convertor 1402 will provide that target duty cycle to the random duty cycle generator 1404, which will generate and provide the random duty cycle clock 1000 to the FLG input of the AND gate 1704. The other input of the AND gate 1704 receives a constant frequency clock CLK. The AND gate 1704 will output a pump clock, which is provided to the clock input of the charge pump 802. Thus, the random duty cycle clock 1000 may either pass or block the constant frequency clock CLK in order to produce the pump clock. The AND gate 1704 may be included in the pump clock generator 1406 (see FIG. 14). The signal CLK in FIG. 17 is one example of the constant frequency clock in FIG. 14.

The comparator 1706 will monitor for the next voltage threshold, which is 5V. While the comparator 1706 is monitoring for 5V the comparator output (voltage flag 1806) will be low. When the output voltage reaches 5V the comparator 1706 output (voltage flag) will go high. This will inform the voltage to duty cycle convertor 1402 that the target duty cycle should be changed. In this example, the voltage to duty cycle convertor 1402 changes the target duty cycle to 40%. The random duty cycle generator 1404 will thus generate a random duty cycle clock 1000 having this new target duty cycle. The comparator 1706 will then monitor for the next voltage threshold, which is 6V. This change can be affected by modifying the value of the variable resistor 1708. Alternatively, the value of Vref can be changed. The voltage flag will go low in response to the change in the voltage threshold. The procedure repeats when the 6V threshold is reached, and again when the 7V threshold is reached. Eventually, the operation will switch from current regulation mode to voltage regulation mode.

To enter the voltage regulation mode switch 1702 is moved to the position to connect the output of the comparator 1706 to the FLG input of the AND gate 1704. The other input of the AND gate 1704 remains connected to the constant frequency clock CLK. In the voltage regulation mode the comparator 1706 will monitor for a target voltage. For example, the target voltage could be a read pass voltage (e.g., Vread_MLC). In an embodiment, if the output voltage is below the target voltage then the comparator 1706 output (flag) is high. However, if the output voltage is above the target voltage then the comparator 1706 output (flag) is low.

Figure 19:
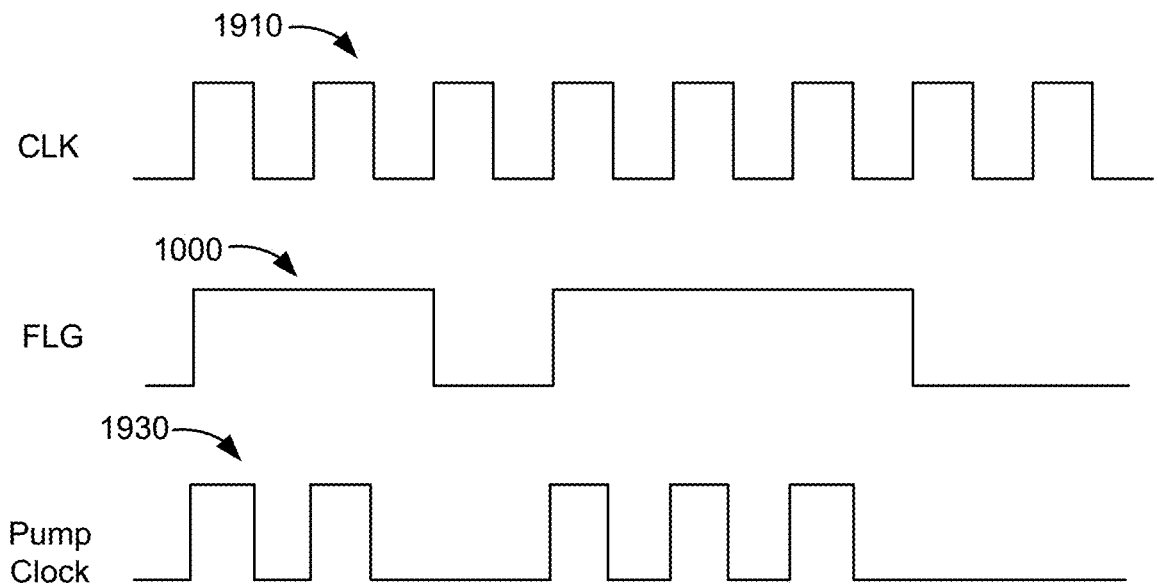
FIG. 19 depicts the timing of signals in an embodiment of the voltage regulator of FIG. 17.

FIG. 19 depicts the timing of signals in an embodiment of the voltage regulator 1700 in FIG. 17. Waveform 1910 depicts an example of the CLK that is input to the AND gate 1704. The waveform 1910 may be input during both the constant current mode and the constant voltage mode. The waveform 1910 has a constant frequency. For example, the frequency may be about 50 kHz. Waveform 1000 depicts an example of a portion of the random duty cycle clock 1000 that is input to the AND gate 1704 during the constant current mode. Waveform 1000 randomly switches from a high state to a low state, but has an average duty cycle equal to the target duty cycle. Waveform 1930 depicts an example of the output of the AND gate 1704, given that the AND gate 1704 inputs waveforms 1910 and 1000. It may be stated that the charge pump 802 receives CLK 1910 only when waveform 1000 is in the high state. Thus, the random duty cycle clock 1000 may either pass or block the constant frequency clock CLK 1910 in order to produce the pump clock 1930. During the constant voltage mode waveform 1000 will not be used. Instead, the Flag output of the comparator 1706 is used. Thus, in the constant voltage mode the Flag output of the comparator 1706 may be used to either pass or block the constant frequency clock CLK 1910 in order to produce the pump clock 1930.

Figure 20:
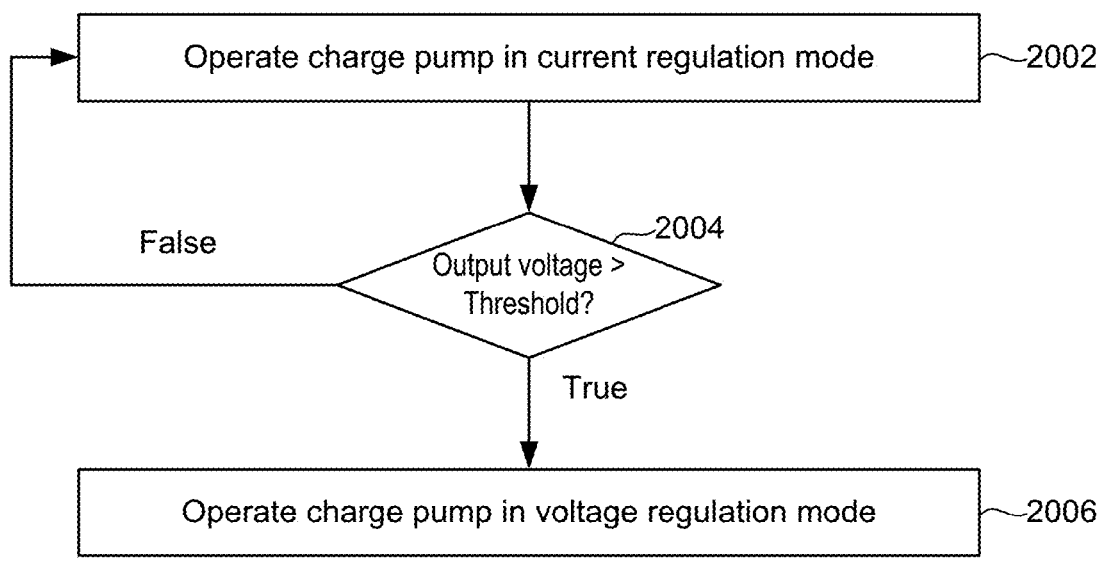
FIG. 20 is a flowchart of one embodiment of a process of operating a charge pump.

FIG. 20 is a flowchart of one embodiment of a process of operating a charge pump. In one embodiment, the process is performed by the voltage regulator 1700 in FIG. 17. In an embodiment, the charge pump output voltage is provided to a control line in the memory structure 202 during both the current regulation mode and the voltage regulation mode. In an embodiment, output voltage is a read pass voltage that is provided to unselected word lines.

Step 2002 includes operating the charge pump 802 in a current regulation mode. In one embodiment, the constant current regulator 804 is used to regulate the Icc of the charge pump as the output voltage is ramping up. The constant current regulator 804 may regulate Icc of the charge pump 802 to a target Icc. It is not required that Icc stay exactly at the target Icc. In some embodiments, the random duty cycle clock generator 1404 is used to generate the random duty cycle clock 1000. A pump clock that is based on the random duty cycle clock 1000 may be provided to the clock input of the charge pump 802 (see, for example, pump clock waveform 1930 in FIG. 19). In an embodiment, the random duty cycle clock 1000 is used to either pass or block the constant frequency clock CLK 1910 in order to produce the pump clock 1930. Thus, a clock signal based on the output voltage is provided by, for example, constant current controller 804, to the clock input of the charge pump 802 to regulate the input current (Icc) while the output voltage is ramping to a threshold voltage.

Step 2004 is a determination of whether the charge pump output voltage exceeds a threshold voltage. This threshold voltage could be the final target voltage or somewhat below the long term target. For example, if the final target voltage is Vread_MLC then the threshold voltage could be Vread_MLC or somewhat below Vread_MLC. After the output voltage crosses the threshold voltage, the charge pump is operated in voltage regulation mode in step 2006. In voltage regulation mode the constant voltage controller 806 is used to hold the output voltage at a target voltage (e.g., Vread_MLC). In the voltage regulation mode the random duty cycle clock 1000 is not used. In an embodiment, the pump clock is based the high frequency clock CLK and the flag from the comparator 1706. In an embodiment, the flag from the comparator 1706 is used to either pass or block the constant frequency clock CLK 1910 in order to produce the pump clock 1930. In an embodiment, when the charge pump output voltage is below the target voltage, the high frequency clock CLK is passed by the flag; however, when the charge pump output voltage is above the target voltage, the high frequency clock CLK is blocked by the flag. Thus, a pump clock based on the output voltage is provided by, for example, constant voltage controller 806, to the clock input of the charge pump 802 to regulate the output voltage after the output voltage has ramped up above the threshold voltage.

Figure 21:
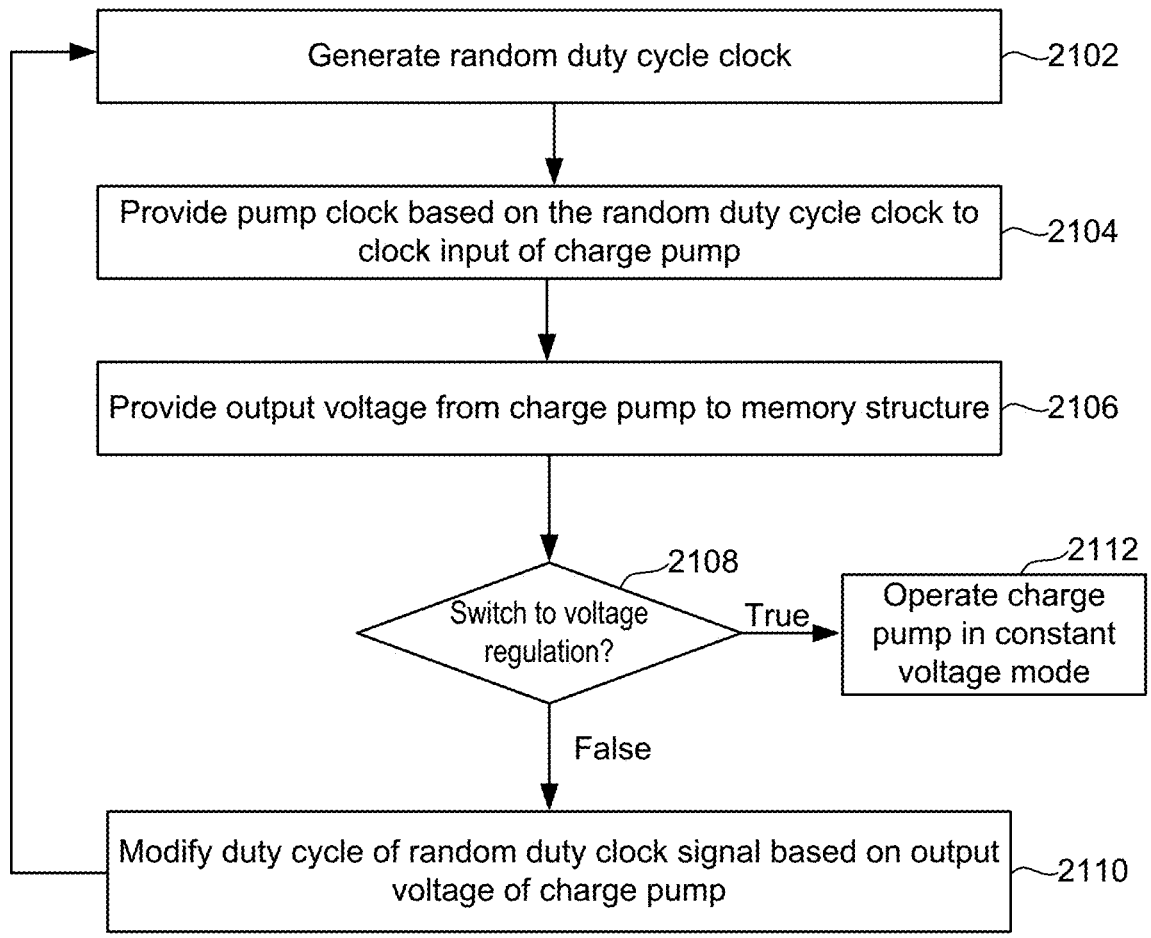
FIG. 21 is a flowchart of one embodiment of a process of operating a charge pump showing further details of operating in the current regulation mode.

FIG. 21 is a flowchart of one embodiment of a process of operating a charge pump showing further details of operating in the current regulation mode. Steps 2102, 2104, 2106 and 2110 provide further details of operating in the current regulation mode. The process begins in response to an instruction to provide a voltage from the charge pump to the memory structure 202. The process begins in the current regulation mode. In step 2102, the random duty cycle clock 1000 is generated.

In step 2104, a pump clock that is based on the random duty cycle clock 1000 is provided to the clock input of the charge pump 802. In an embodiment, step 2104 includes passing a constant frequency clock signal to the clock input of the charge pump 802 when the random duty cycle clock signal 1000 has a high state; and blocking the constant frequency clock signal from reaching the clock input of the charge pump 802 when the random duty cycle clock signal 1000 has a low state. For example, the pump clock waveform 1930, which is based on the random duty cycle clock 1000, may be provided to the clock input. In an embodiment, the random duty cycle clock 1000 is used to either pass or block the constant frequency clock CLK 1910 in order to produce the pump clock 1930.

In step 2106, the output voltage of the charge pump 802 is provided to the memory structure 202. In one embodiment, the output voltage is provided to a word line during a memory operation. In one embodiment, the output voltage is a read pass voltage provided to an unselected word line during a read operation. Step 2108 is a determination of whether to switch to voltage regulation mode. The determination may be based on the magnitude of the output voltage. Assuming that current regulation mode is maintained, then in step 2110 the duty cycle of the random duty cycle clock 1000 is modified in step 2110, based on the output voltage. The process then returns to step 2102 to generate a modified random duty cycle clock 1000. Eventually, operation will switch to the voltage regulation mode, in step 2110.

Figure 22:
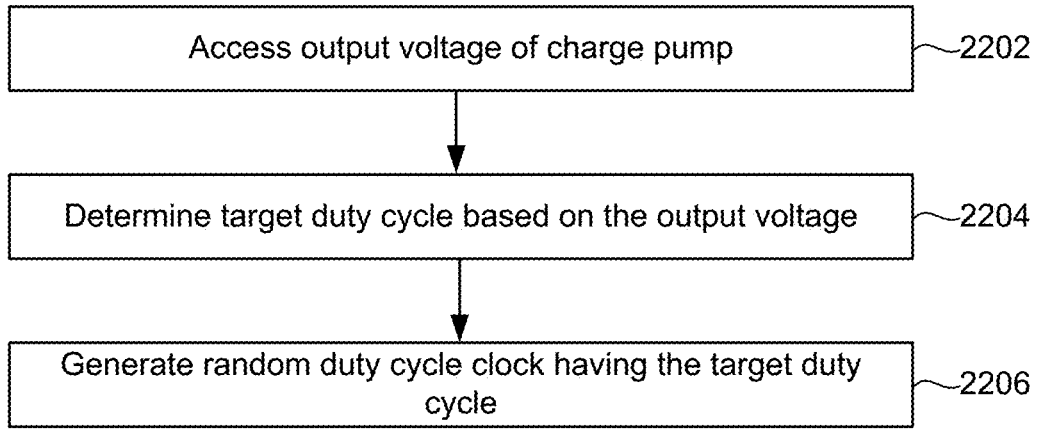
FIG. 22 is a flowchart of one embodiment of a process of generating the random duty cycle clock.

FIG. 22 is a flowchart of one embodiment of a process of generating the random duty cycle clock 1000. The process is performed in an embodiment of the current regulation mode. The process provides further details for one embodiment of step 2102 in FIG. 21. Step 2202 includes accessing the output voltage of the charge pump 802. In one embodiment, the comparator 1706 accesses the output voltage via variable resistor 1708. The comparator 1706 provides the voltage flag to the duty cycle convertor 1402, which informs the duty cycle convertor 1402 of whether the output voltage has crossed the next voltage threshold (see FIG. 18).

Step 2204 includes determining a target duty cycle based on the output voltage. In one embodiment, the voltage to duty cycle convertor 1402 determines the target duty cycle based on the voltage flag from the comparator 1706. Step 2206 includes generating the random duty cycle clock 1000 that has the target duty cycle. In one embodiment, the random duty cycle generator 1404 uses a random number generator to generate the random duty cycle clock 1000. In one embodiment, the random duty cycle generator 1404 uses a delta-sigma based duty cycle generator to generate the random duty cycle clock 1000.

Figure 23:
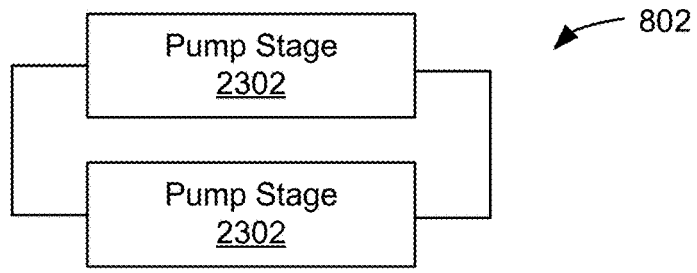
FIG. 23 depicts an embodiment in which the charge pump has two pump stages in a parallel configuration.
Figure 24:
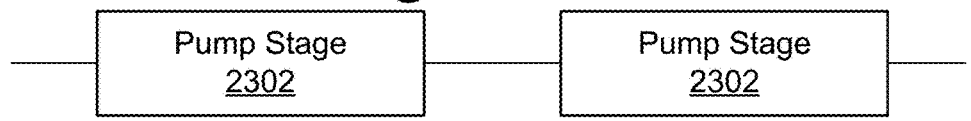
FIG. 24 depicts an embodiment in which the charge pump has two pump stages in a series configuration.

In some embodiments, the physical configuration of the charge pump 802 may change during the current regulation mode. FIG. 23 depicts an embodiment in which the charge pump 802 has two pump stages 2302 in a parallel configuration. FIG. 24 depicts an embodiment in which the charge pump 802 has two pump stages 2302 in a series configuration. In one embodiment, the charge pump 802 has the parallel configuration for a portion of the current regulation mode and the series configuration for a different portion of the current regulation mode. Switching between the parallel and series configurations can improve efficiency. However, such physical configuration changes can impact the charge pump current to output voltage relationship. Further details of series and parallel configurations of charge pump stages are described in U.S. Pat. No. 9,479,050, entitled "High-Efficiency Fractional Pump".

Figure 25:
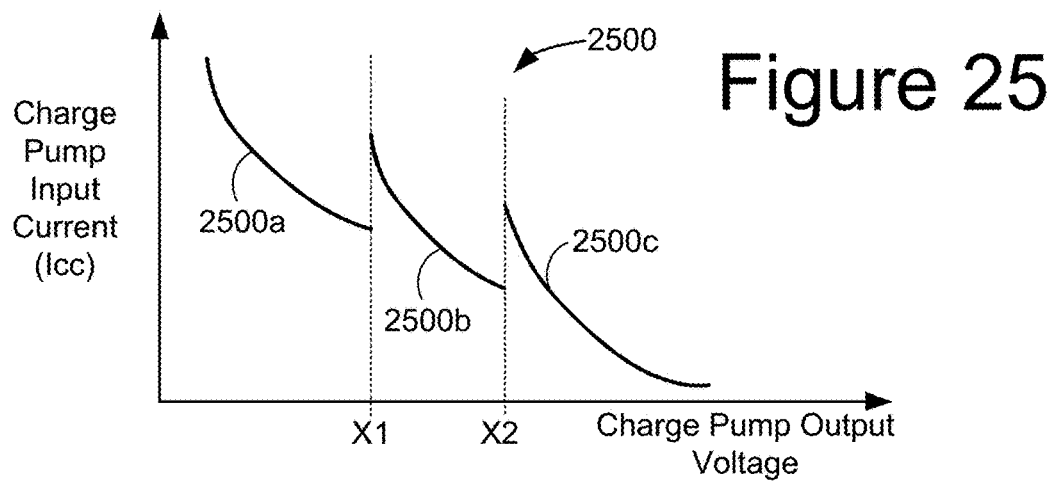
FIG. 25 shows a charge pump current (Icc) to output voltage relationship for a case in which the physical configuration changes while the output voltage is ramping up.

FIG. 25 shows a charge pump current (Icc) to output voltage relationship for a case in which the physical configuration changes while the output voltage is ramping up. A change in the physical configuration may lead to one or more discontinuities in the Icc to output voltage curve. The plot 2500 is divided into three portions 2500a, 2500b and 2500c, with discontinuities at points X1 and X2.

Figure 26:
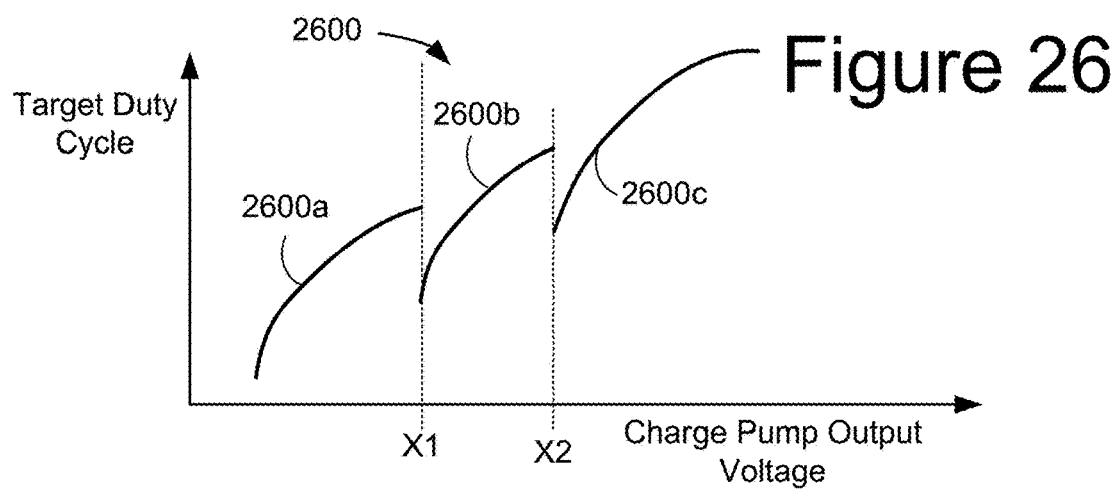
FIG. 26 shows duty cycle versus output voltage for a target Icc that corresponds to the plot 2500 in FIG. 25.

FIG. 26 shows target duty cycle versus output voltage for a target Icc that corresponds to the plot 2500 in FIG. 25. The plot 2600 is for a target Icc and is divided into portions 2600a, 2600b, and 2600c. Portion 2600a corresponds to portion 2500a, portion 2600b corresponds to portion 2500b, and portion 2600c corresponds to portion 2500c. Plot 2600 depicts discontinuities at points X1 and X2, corresponding to the discontinuities in plot 2500 in FIG. 25.

Similar to the example discussed in connection with FIGS. 11 and 12, a lookup table can be produced to characterize plot 2600. Thus, the voltage to duty cycle convertor 1402 may determine the target duty cycle for the plot 2600 in FIG. 26, or other plots having discontinuities.

In some embodiments, the memory system compensates the target duty cycle for the current regulation mode for variations in process, voltage, and/or temperature (PVT). In one embodiment, the memory system compensates for die to die differences between charge pumps. The charge pump to output voltage plots depicted in FIGS. 11 and 25, as well as the target duty cycle to output voltage plots depicted in FIGS. 12 and 26 may be for a typical charge pump. However, there may be some die to die differences between charge pumps. In an embodiment, the charge pump on a specific die may be analyzed to determine differences between its Icc to output voltage characteristics from the typical charge pump. Such difference could be due at least in part to differences in internal capacitance of the charge pumps on different dies. One technique is to measure the internal capacitance of the charge pump on a given die and determine an offset based on that measurement. In one embodiment, an offset to the target duty cycle is determined for the specific charge pump. This offset may, for example, be added or subtracted from the duty cycle values in table 1300 (see FIG. 13). The offset may be stored as a parameter in the memory structure 202 and loaded into storage 266 upon memory system power up.

Similar compensations can be made for the present environmental temperature. For example, the values in table 1300 may correspond to a normal operating temperature. An offset may be added (or subtracted) to the duty cycle values in table 1300 based on the present operating temperature. The amount of the offset may be determined by, for example, determining the effect temperature has on the charge pump current (Icc) to output voltage relationship (and hence the target duty cycle to output voltage relationship).

In view of the foregoing, a first embodiment includes an apparatus, comprising a charge pump having a clock input configured to receive a clock signal, a power input configured to receive a supply voltage, and an output. The charge pump is configured to provide an output voltage at the output that depends on the clock signal. The apparatus has one or more control circuits in communication with the charge pump. The one or more control circuits are configured to connect to a memory structure comprising memory cells and control lines. The one or more control circuits are configured to provide the output voltage to a control line in the memory structure. The one or more control circuits are configured to operate the charge pump in a current regulation mode in which a first clock signal based on the output voltage is provided to the clock input to regulate input current at the power input to a target current while the output voltage is ramping to a threshold voltage. The one or more control circuits are configured to operate the charge pump in a voltage regulation mode in which a second clock signal based on the output voltage is provided to the clock input to regulate the output voltage to a target voltage after the output voltage has ramped up above the threshold voltage.

In a second embodiment, in furtherance to the first embodiment, the one or more control circuits are configured to generate a random duty cycle clock signal based on the output voltage as the output voltage is ramping up. The random duty cycle clock signal has an average duty cycle over a time window that meets a target duty cycle given the output voltage. The one or more control circuits are configured to generate the first clock signal by passing a constant frequency clock signal when the random duty cycle clock signal has a high state and blocking the constant frequency clock signal when the random duty cycle clock signal has a low state.

In a third embodiment, in furtherance to the second embodiment, the one or more control circuits are configured to generate the second clock signal by passing the constant frequency clock signal when the output voltage is below the target voltage and blocking the constant frequency clock signal when the output voltage is above the target voltage.

In a fourth embodiment, in furtherance to the second embodiment, the one or more control circuits are configured to regulate the random duty cycle clock signal to have a first target duty cycle while the output voltage is in a first voltage range. The one or more control circuits are configured to regulate the random duty cycle clock signal to have a second target duty cycle while the output voltage is in a second voltage range, wherein the second voltage range does not overlap the first voltage range.

In a fifth embodiment, in furtherance any of the second to fourth embodiments, the apparatus further comprises a lookup table that maps a magnitude of the output voltage to the target duty cycle. The one or more control circuits modify the target duty cycle based on the lookup table.

In a sixth embodiment, in furtherance to any of the second to fifth embodiments, the one or more control circuits are configured to operate the charge pump in a first configuration having parallel pump stages during a first period of time as the output voltage is ramped and operate the charge pump in a second configuration having series pump stages during a second period of time as the output voltage is ramped. The one or more control circuits are configured to modify the target duty cycle based on a first mapping of output voltage to target duty cycle when operating the charge pump in the first configuration during the first period of time, wherein the first mapping is based on the first configuration. The one or more control circuits are configured to modify the target duty cycle based on a second mapping of output voltage to target duty cycle when operating the charge pump in the second configuration during the second period of time, wherein the second mapping is based on the second configuration.

In a seventh embodiment, in furtherance to any of the second to sixth embodiments, the one or more control circuits are configured to access an offset based on a die-to-die variation of capacitance in the charge pump and modify the target duty cycle based on the offset.

In an eighth embodiment, in furtherance to any of the second to seventh embodiments, the one or more control circuits are configured to access an offset based on a present operating temperature and modify the target duty cycle mapping based on the offset.

In a ninth embodiment, in furtherance to the any of the first to eighth embodiments, the one or more control circuits are configured to provide the output voltage to a word line in the memory structure.

In a tenth embodiment, in furtherance to any of the first to the ninth embodiments, the output voltage comprises a read pass voltage.

In an eleventh embodiment, in furtherance to any of the first to tenth embodiments, the charge pump and the one or more control circuits reside on a first semiconductor die. The memory structure resides on a second semiconductor die.

One embodiment includes a method for operating a charge pump. The method comprises operating the charge pump in a first regulation mode while an output voltage of the charge pump is ramping to a threshold voltage. The first regulation mode includes determining a target duty cycle based on an output voltage of the charge pump; generating a random duty cycle clock signal having an average duty cycle over a time window that is the target duty cycle that corresponds to a target input current of the charge pump; and providing a first clock signal that is based on the random duty cycle clock signal to a clock input of the charge pump to regulate input current of the charge pump. The method comprises operating the charge pump in a second regulation mode after the output voltage of the charge pump crosses the threshold voltage, including providing a second clock signal to the clock input of the charge pump to regulate the output voltage to meet a target voltage. The method comprises providing the output voltage to a word line of a memory structure while operating the charge pump in both the first regulation mode and the second regulation mode, wherein the word line connects to memory cells.

One embodiment includes a non-volatile storage system comprising a memory structure having a plurality of NAND strings and a plurality of word lines associated with the NAND strings. The non-volatile storage system has a charge pump having a clock input configured to receive a clock signal, a power input configured to receive an input current, and an output. The charge pump is configured to provide an output voltage at the output that depends on the clock signal. The non-volatile storage system has one or more control circuits in communication with the charge pump and the memory structure. The one or more control circuits are configured to: provide the output voltage to a word line in the memory structure; determine a target duty cycle based on the output voltage as the output voltage is ramping to a threshold voltage; generate a random duty cycle clock signal having an average duty cycle that over a time window is equal to the target duty cycle; pass a constant frequency clock signal to the clock input of the charge pump when the random duty cycle clock signal has a high state while the output voltage is ramping to the threshold voltage; and block the constant frequency clock signal from reaching the clock input of the charge pump when the random duty cycle clock signal has a low state while the output voltage is ramping to the threshold voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
    a charge pump having a clock input configured to receive a clock signal, a power input configured to receive a supply voltage, and an output, wherein the charge pump is configured to provide an output voltage at the output that depends on the clock signal; and
    one or more control circuits in communication with the charge pump, the one or more control circuits configured to connect to a memory structure comprising memory cells and control lines, wherein the one or more control circuits are configured to:
        provide the output voltage to a control line in the memory structure;
        operate the charge pump in a current regulation mode in which a first clock signal based on the output voltage is provided to the clock input to regulate input current at the power input to a target current while the output voltage is ramping to a threshold voltage; and
        operate the charge pump in a voltage regulation mode in which a second clock signal based on the output voltage is provided to the clock input to regulate the output voltage to a target voltage after the output voltage has ramped up above the threshold voltage.

2. The apparatus of claim 1, wherein the one or more control circuits are configured to:
    generate a random duty cycle clock signal based on the output voltage as the output voltage is ramping up, wherein the random duty cycle clock signal has an average duty cycle over a time window that meets a target duty cycle given the output voltage; and
    generate the first clock signal by passing a constant frequency clock signal when the random duty cycle clock signal has a high state and blocking the constant frequency clock signal when the random duty cycle clock signal has a low state.

3. The apparatus of claim 2, wherein the one or more control circuits are configured to:
    generate the second clock signal by passing the constant frequency clock signal when the output voltage is below the target voltage and blocking the constant frequency clock signal when the output voltage is above the target voltage.

4. The apparatus of claim 2, wherein the one or more control circuits are configured to:
    regulate the random duty cycle clock signal to have a first target duty cycle to regulate the input current to the target current while the output voltage is in a first voltage range; and
    regulate the random duty cycle clock signal to have a second target duty cycle to regulate the input current to the target current while the output voltage is in a second voltage range, wherein the second voltage range does not overlap the first voltage range.

5. The apparatus of claim 2, further comprising a lookup table that maps a magnitude of the output voltage to the target duty cycle, wherein the one or more control circuits modify the target duty cycle based on the lookup table.

6. The apparatus of claim 2, wherein the one or more control circuits are configured to:

operate the charge pump in a first configuration having parallel pump stages during a first period of time as the output voltage is ramped;

operate the charge pump in a second configuration having series pump stages during a second period of time as the output voltage is ramped;

modify the target duty cycle based on a first mapping of output voltage to target duty cycle when operating the charge pump in the first configuration during the first period of time, wherein the first mapping is based on the first configuration; and modify the target duty cycle based on a second mapping of output voltage to target duty cycle when operating the charge pump in the second configuration during the second period of time, wherein the second mapping is based on the second configuration.

7. The apparatus of claim 2, wherein the one or more control circuits are configured to:

access an offset based on a die-to-die variation of capacitance in the charge pump; and modify the target duty cycle based on the offset.

8. The apparatus of claim 2, wherein the one or more control circuits are configured to:

access an offset based on a present operating temperature; and modify the target duty cycle mapping based on the offset.

9. The apparatus of claim 1, wherein the one or more control circuits are configured to provide the output voltage to a word line in the memory structure.

10. The apparatus of claim 9, wherein the output voltage comprises a read pass voltage.

11. The apparatus of claim 1, wherein:

the charge pump and the one or more control circuits reside on a first semiconductor die; and the memory structure resides on a second semiconductor die.

12. A method for operating a charge pump, the method comprising:

operating the charge pump in a first regulation mode while an output voltage of the charge pump is ramping to a threshold voltage, including:

determining a target duty cycle based on an output voltage of the charge pump;

generating a random duty cycle clock signal having an average duty cycle over a time window that is the target duty cycle that corresponds to a target input current of the charge pump; and providing a first clock signal that is based on the random duty cycle clock signal to a clock input of the charge pump to regulate input current of the charge pump;

operating the charge pump in a second regulation mode after the output voltage of the charge pump crosses the threshold voltage, including providing a second clock signal to the clock input of the charge pump to regulate the output voltage to meet a target voltage; and providing the output voltage to a word line of a memory structure while operating the charge pump in both the first regulation mode and the second regulation mode, wherein the word line connects to memory cells.

13. The method of claim 12, wherein providing the first clock signal that is based on the random duty cycle clock signal to the clock input of the charge pump comprises:

passing a constant frequency clock signal to the clock input of the charge pump when the random duty cycle clock signal has a high state; and blocking the constant frequency clock signal from reaching the clock input of the charge pump when the random duty cycle clock signal has a low state.

14. The method of claim 12, wherein determining the target duty cycle based on the output voltage of the charge pump comprises:

determining a target duty cycle that regulates the input current of the charge pump to a target current, wherein the target duty cycle depends on a magnitude of the output voltage.

15. The method of claim 12, wherein providing the output voltage to the word line of the memory structure while operating the charge pump in both the first regulation mode and the second regulation mode comprises:

providing a read pass voltage to an unselected word line in the memory structure, wherein the memory structure comprises NAND strings having memory cells connected to the unselected word line.

16. A non-volatile storage system, comprising:

a memory structure having a plurality of NAND strings and a plurality of word lines associated with the NAND strings;

a charge pump having a clock input configured to receive a clock signal, a power input configured to receive an input current, and an output, wherein the charge pump is configured to provide an output voltage at the output that depends on the clock signal; and one or more control circuits in communication with the charge pump and the memory structure, the one or more control circuits configured to:

provide the output voltage to a word line in the memory structure;

determine a target duty cycle based on the output voltage as the output voltage is ramping to a threshold voltage;

generate a random duty cycle clock signal having an average duty cycle that over a time window is equal to the target duty cycle;

pass a constant frequency clock signal to the clock input of the charge pump when the random duty cycle clock signal has a high state while the output voltage is ramping to the threshold voltage; and block the constant frequency clock signal from reaching the clock input of the charge pump when the random duty cycle clock signal has a low state while the output voltage is ramping to the threshold voltage.

17. The system of claim 16, wherein the one or more control circuits are configured to:

access information that indicates the target duty cycle to achieve a target input current given a present output voltage; and determine the target duty cycle based on the information and the present output voltage.

18. The system of claim 17, wherein the one or more control circuits are configured to:

regulate the output voltage to meet a target voltage after the output voltage has ramped up above the threshold voltage.

19. The system of claim 16, wherein the one or more control circuits are configured to:

operate the charge pump in a first configuration having parallel pump stages during a first period of time as the output voltage is ramped;

operate the charge pump in a second configuration having series pump stages during a second period of time as the output voltage is ramped;

determine the target duty cycle based on a first mapping of output voltage to target duty cycle when operating the charge pump in the first configuration, wherein the first mapping is based on the first configuration; and determine the target duty cycle based on a second mapping of output voltage to target duty cycle when operating the charge pump in the second configuration, wherein the second mapping is based on the second configuration.

20. The system of claim 16, wherein the one or more control circuits are configured to:

provide the output voltage to unselected word lines in the memory structure during a read operation, wherein the output voltage is a read pass voltage.

* * * * *